United States Patent
Kupcow et al.

(10) Patent No.: US 12,230,519 B2
(45) Date of Patent: Feb. 18, 2025

(54) METHOD AND APPARATUS FOR MULTIPLE AXIS DIRECT TRANSFERS OF SEMICONDUCTOR DEVICES

(71) Applicant: Cowles Semi, LLC, Spokane, WA (US)

(72) Inventors: Sean Kupcow, Greenacres, WA (US); Nicholas Steven Busch, Spokane, WA (US); Justin Wendt, Post Falls, ID (US)

(73) Assignee: COWLES SEMI, LLC, Spokane, WA (US)

( * ) Notice: Subject to any disclaimer, the term of this patent is extended or adjusted under 35 U.S.C. 154(b) by 144 days.

(21) Appl. No.: 17/751,444

(22) Filed: May 23, 2022

(65) Prior Publication Data
US 2023/0377917 A1    Nov. 23, 2023

(51) Int. Cl.
*H01L 21/67* (2006.01)
(52) U.S. Cl.
CPC .............................. *H01L 21/67132* (2013.01)
(58) Field of Classification Search
CPC ......... H01L 21/67132; H01L 21/67144; Y10T 156/1906; B32B 37/025; B32B 38/10
USPC ................................. 156/249, 235, 230, 231
See application file for complete search history.

(56) References Cited

U.S. PATENT DOCUMENTS

| | | |
|---|---|---|
| 10,410,905 B1 | 9/2019 | Peterson et al. |
| 11,069,555 B2 | 7/2021 | Brewel et al. |
| 2012/0014084 A1 | 1/2012 | Motomura et al. |
| 2020/0168587 A1 | 5/2020 | Huska et al. |

FOREIGN PATENT DOCUMENTS

JP    2002110709 A    4/2002

OTHER PUBLICATIONS

MachineDesign "Engineering Refresher: The Basics and Benefits of Electromechanical Actuators" Apr. 2018.*
PCT Search Report and Written Opinion mailed Oct. 2, 2023 for PCT application No. PCT/US23/23238, 12 pages.

* cited by examiner

*Primary Examiner* — John L Goff, II
(74) *Attorney, Agent, or Firm* — Lee & Hayes, P.C.

(57) ABSTRACT

An apparatus for a direct transfer of a semiconductor device die from a wafer tape to a substrate. A first frame holds the wafer tape and a second frame secures the substrate. The second frame holds the substrate such that a transfer surface is disposed facing the semiconductor device die on a first side of the wafer tape. A needle is disposed adjacent a second side of the wafer tape opposite the first side. A length of the needle extends in a direction toward the wafer tape. A first needle actuator is used to adjust an angle of the needle to align the die, wafer tape, and transfer surface at which point the needle presses on the second side of the wafer tape to press a semiconductor device die of the one or more semiconductor device die into contact with the transfer surface of the substrate.

6 Claims, 13 Drawing Sheets

METHOD AND APPARATUS FOR MULTIPLE AXIS DIRECT TRANSFERS OF SEMICONDUCTOR DEVICES

CROSS REFERENCE TO RELATED PATENT APPLICATIONS

This application incorporates: U.S. patent application Ser. No. 14/939,896, filed on Nov. 12, 2014, entitled "Apparatus for Transfer of Semiconductor Devices," now patented as U.S. Pat. No. 9,633,883; U.S. patent application Ser. No. 15/343,055, filed on Nov. 3, 2016, entitled "Compliant Needle for Direct Transfer of Semiconductor Devices;" U.S. patent application Ser. No. 15/360,471, filed on Nov. 23, 2016, entitled "Top-Side Laser for Direct Transfer of Semiconductor Devices;" U.S. patent application Ser. No. 15/360,645, filed on Nov. 23, 2016, entitled "Pattern Array Direct Transfer Apparatus and Method Therefor;" U.S. patent application Ser. No. 15/409,409, filed on Jan. 18, 2017, entitled "Flexible Support Substrate for Transfer of Semiconductor Devices;" U.S. patent application Ser. No. 15/987,094, filed on May 12, 2018, entitled "Method and Apparatus for Multiple Direct Transfers of Semiconductor Devices;" and U.S. patent application Ser. No. 16/147,456, filed on Sep. 28, 2018, entitled "Method and Apparatus for Increased Transfer Speed of Semiconductor Devices," now patented as U.S. Pat. No. 11,094,571; all of which are incorporated in their entireties by reference.

BACKGROUND

Semiconductor devices are electrical components that utilize semiconductor material, such as silicon, germanium, gallium arsenide, and the like. Semiconductor devices are typically manufactured as single discrete devices or as integrated circuits (ICs). Examples of single discrete devices include electrically-actuatable elements such as light-emitting diodes (LEDs), diodes, transistors, resistors, capacitors, fuses, and the like.

The fabrication of semiconductor devices typically involves an intricate manufacturing process with a myriad of steps. The end-product of the fabrication is a "packaged" semiconductor device. The "packaged" modifier refers to the enclosure and protective features built into the final product as well as the interface that enables the device in the package to be incorporated into an ultimate circuit.

The conventional fabrication process for semiconductor devices starts with handling a semiconductor wafer. The wafer is diced into a multitude of "unpackaged" semiconductor devices. The "unpackaged" modifier refers to an unenclosed semiconductor device without protective features. Herein, one or more unpackaged semiconductor devices may be called semiconductor device die, or just "die" for simplicity. A single semiconductor wafer may be diced to create die of various sizes, so as to form upwards of more than 100,000 or even 1,000,000 die from the semiconductor wafer (depending on the starting size of the semiconductor), and each die has a certain quality. The unpackaged die is then "packaged" via a conventional fabrication process discussed briefly below. The actions between the wafer handling and the packaging may be referred to as "die preparation."

In some instances, the die preparation may include sorting the die via a "pick and place process," whereby diced die is picked up individually and sorted into bins. The sorting may be based on the forward voltage capacity of the die, the average power of the die, and/or the wavelength of the die.

Typically, the packaging involves mounting a die into a plastic or ceramic package (e.g., mold or enclosure). The packaging also includes connecting the die contacts to pins/wires for interfacing/interconnecting with ultimate circuitry. The packaging of the semiconductor device is typically completed by sealing the die to protect it from the environment (e.g., dust).

A product manufacturer then places packaged semiconductor devices in product circuitry. Due to the packaging, the devices are ready to be "plugged in" to the circuit assembly of the product being manufactured. Additionally, while the packaging of the devices protects them from elements that might degrade or destroy the devices, the packaged devices are inherently larger (e.g., in some cases, around 10 times the thickness and 10 times the area, resulting in 100 times the volume) than the die found inside the package. Thus, the resulting circuit assembly cannot be any thinner than the packaging of the semiconductor devices.

As mentioned previously, conventional semiconductor transfer devices typically pick, and place die individually from sorted bins. This process introduces a plurality of inefficiencies in the system. Furthermore, a pick and place technique make a process of placing multiple die simultaneously cumbersome and inefficient. Frequently, the components and/or methods, or combinations thereof, associated with conventional devices are less effective, or even incapable, of transferring semiconductor die at a speed that is economically satisfactory to produce a product when using die such as those described herein.

BRIEF DESCRIPTION OF THE DRAWINGS

The Detailed Description is set forth with reference to the accompanying figures. In the figures, the left-most digit(s) of a reference number identifies the figure in which the reference number first appears. The use of the same reference numbers in different figures indicates similar or identical items. Furthermore, the drawings may be considered as providing an approximate depiction of the relative sizes of the individual components within individual figures. However, the drawings are not to scale, and the relative sizes of the individual components, both within individual figures and between the different figures, may vary from what is depicted. In particular, some of the figures may depict components as a certain size or shape, while other figures may depict the same components on a larger scale or differently shaped for the sake of clarity.

DETAILED DESCRIPTION

Figure 1:
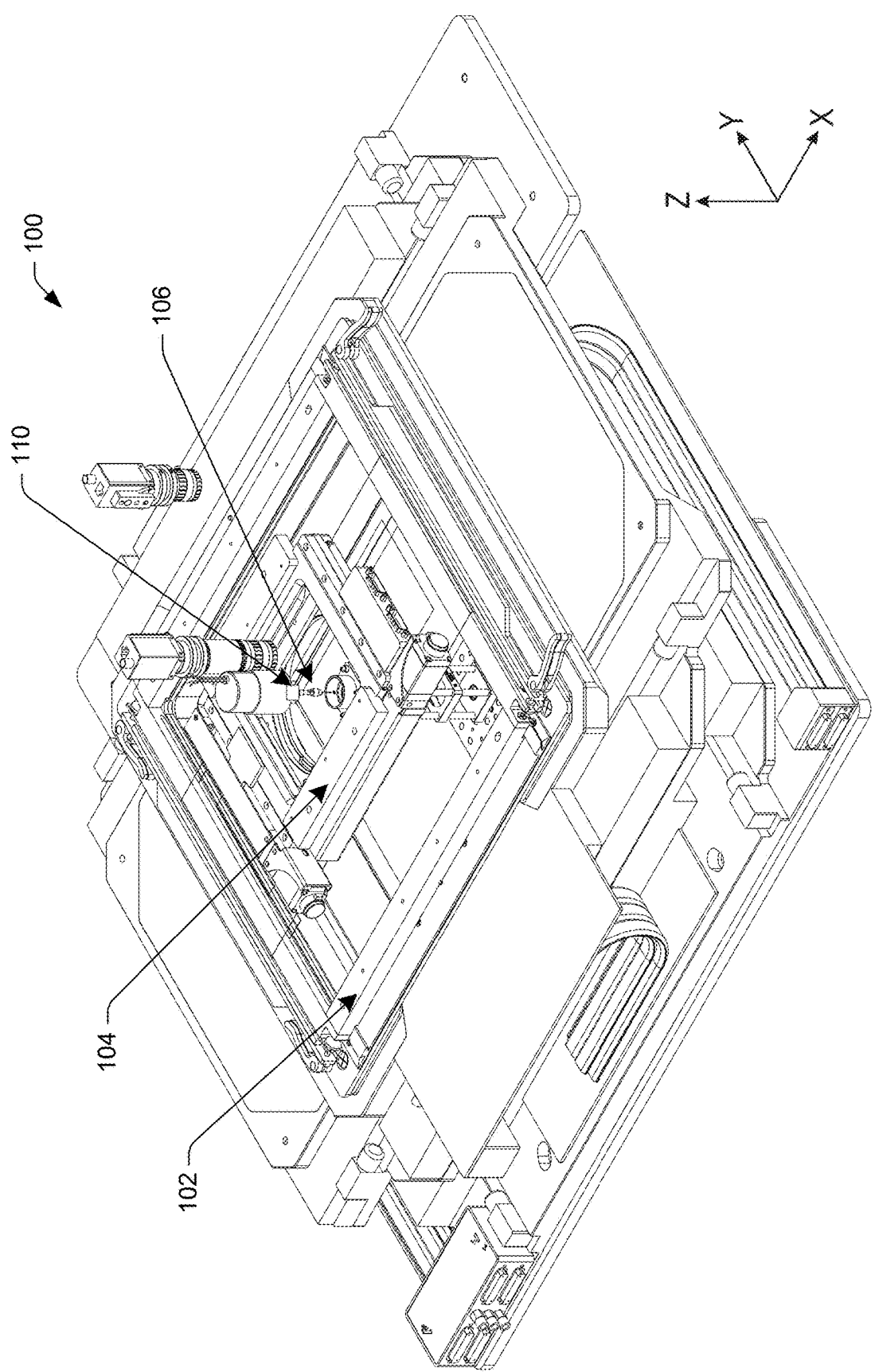
FIG. 1 illustrates an isometric view of an embodiment of a transfer apparatus, according to this disclosure.

This disclosure is directed to a machine that directly transfers and affixes semiconductor device die to a circuit, a process for achieving the same, and a circuit having die affixed thereto (e.g., the completed circuit being the output product. Notably, it is considered that even a product made using an embodiment of the disclosed machine and process is an improved product compared to one made otherwise, since the improvements to a product created via an embodiment of the disclosed machine and/or method may impart additional improvements to the output product). In an embodiment, the machine functions to transfer unpackaged die directly from a substrate, such as a "wafer tape," to a support substrate, such as a circuit substrate. The direct transfer of unpackaged die may significantly reduce the thickness of an end product compared to a similar product produced by conventional means, as well as the amount of time and/or cost to manufacture the support substrate.

For the purpose of this description, the term "substrate" refers to any substance on which, or to which, a process or action occurs. Further, the term "product" refers to the desired output from a process or action, regardless of the state of completion, which is subjective to the user/receiver. Thus, a support substrate refers to any substance on which, or to which, a process or action is caused to occur for a desired output.

In an embodiment, the machine may secure a support substrate for receiving "unpackaged" die, such as LEDs, transferred from the wafer tape, for example. In an effort to reduce the dimensions of the products using the die, the die is very small and thin, for example, a die may be about 50 microns (μm) thick, or more or less. The thickness may be measured as the total height of the die. In an embodiment, the die thickness may range from 3 microns to 100 microns, or from 15 microns to 85 microns, or from 35 microns to 65 microns, or from 45 microns to 55 microns, for example. In general, anything less than 100 microns is considered in the industry to be a "microLED." Nevertheless, in an embodiment, the die (e.g., LED, etc.) may be a miniLED, having a thickness ranging from about 100 microns to about 200 microns. Regardless, due to the relatively small size of the die, the machine includes components that function to precisely align both the wafer tape carrying the die and the support substrate to ensure accurate placement and/or avoid product material waste. In an embodiment, the components that align the support substrate and the die on the wafer tape may include a set of frames in which the wafer tape and the support substrate are secured respectively and conveyed individually to a position of alignment such that a specific die on the wafer tape is transferred to a specific spot on the support substrate.

The frame that conveys the support substrate may travel in various directions, including in-plane horizontal, vertical, and/or rotational directions for various axes of alignment, or even out-of-plane directions that would permit transfer to a curved surface. The frame that conveys the wafer tape may travel in various directions also. A system of gears, tracks, motors, and/or other elements may be used to secure and convey the frames carrying the support substrate and the wafer tape respectively to align the support substrate with the wafer tape in order to place a die on the correct position of the support substrate. Each frame system may also be moved to an extraction position in order to facilitate extraction of the wafer tape and the support substrate upon completion of the transfer process. It is also to be appreciated that any or all of the first substrate, second substrate, and transfer mechanism may be movable with respect to each other to facilitate the most efficient alignment of components based on the particular embodiment.

Note, the conveyance mechanisms are generally extremely heavy due to the low tolerance of undesired movement, since a minor error in the respective positions thereof may cause improper alignment during a transfer, thereby causing a failure to accurately place a die during a transfer position. That is, the relative bulk weight of the conveyance mechanisms in a transfer system helps to minimize unintentional movements of the components due to structural vibrations from many potential sources including for example terrestrial, human, adjacent machinery, and/or even minor vibrations induced by the motion (e.g., start/stop, transit, etc.) of a systems own conveyance mechanisms. However, the starting and stopping of the heavy componentry of the conveyance mechanisms in conventional systems causes an increase in the overall time to produce accurate consecutive transfers. Accordingly, in an effort to enhance the speed of transfer, as described with respect to embodiments disclosed herein, it may be desirable to configure one or more of the conveyance mechanisms to function in relatively continuous motion during a series of consecutive transfers of die.

In an embodiment, the components that align the support substrate and the die on the wafer tape include one or more adjustment mechanisms that convey the wafer tape in small distances (e.g., 5 microns to 50 microns, or 1 micron to 1000 microns, or 0.5 micron to 5000 microns, etc.) to fine-adjust the desired location of the transfer die transfer location to die transfer location. These small conveyances (hereafter micro-adjustments) can counteract locational inaccuracies of the frame that conveys the wafer tape due to vibration caused by starting and stopping conveyance of the frames (coarse adjustments of the conveyance mechanism(s)) in rapid succession. The inertial vibration noise can vary depending on velocity, unit mass, deceleration, etc. for the needle, die, frames, or other components of the die transfer system that can be in motion. A micro-adjustment occurs rapidly (e.g., about 0.5 ms from start to end of the micro-adjustment) to counteract the vibration prior to die transfer. Additionally, after conveying the tape to a transfer location and transferring the die, subsequent micro-adjustments may be made to align additional transfer locations and transfer die prior to the next coarse adjustment.

In an embodiment, the machine further includes a transfer mechanism for transferring the die directly from the wafer tape to the support substrate without "packaging" the die. The transfer mechanism may be disposed vertically above the wafer tape so as to press down on the die via the wafer tape toward the support substrate. This process of pressing down on the die may cause the die to peel off of the wafer tape, starting at the sides of the die until the die separates from the wafer tape to be attached to the support substrate. That is, by reducing the adhesion force between the die and the wafer tape, and by increasing the adhesion force between the die and the support substrate, the die may be transferred.

In an embodiment, the transfer mechanism may include an elongated rod, such as a pin or needle that may be cyclically actuated against the wafer tape to push the wafer tape from a top side. Note, for the sake of convenience and clarity hereinafter, the term "needle" is used predominantly to refer to the portion of the transfer mechanism that is a form of an elongated rod, disclosed above. Nevertheless, it is contemplated that those skilled in the art will understand that other forms elongated rods may be known or referenced by other terms that would be satisfactory substitutes for the instant use of "needle." Additionally, and/or alternatively, the transfer mechanism may include a plurality of needles that may be individually actuated against the wafer tape. In an embodiment, the needle, or needles, may be sized such that at least an end thereof is no wider than a width of the die being transferred. Although not shown, in a different embodiment, it is contemplated that the width of the end of the needle may be wider than a width of the die. When the end of the needle contacts the wafer tape, the wafer tape may experience a local deflection at the area between the die and the wafer tape. Inasmuch as the deflection is highly localized and rapidly performed, the portion of the wafer tape that does not receive pressure from the needle may begin to flex away from the surface of the die. This partial separation may thus cause the die to lose sufficient contact with the wafer tape, so as to be released from the wafer tape. Moreover, in an embodiment, the deflection of the wafer tape may be so minimal, as to maintain an entirety of the surface area of the die in contact with the wafer tape, while still causing the opposing surface of the die to extend beyond a plane of extension of the corresponding surface of the adjacent die to avoid unintentional transfer of the adjacent die.

In an embodiment, the transfer mechanism may include one or more actuators to actuate at least a portion of the transfer mechanism (e.g., the end of a needle, the entire needle, etc.) in an axially aligned motion against the wafer tape (e.g., in at least a Z-direction) and to change the direction and/or orientation of at least the portion of the transfer mechanism to facilitate the transfer of one or more die to a substrate without either of: 1) re-positioning the portion or the entirety of the transfer mechanism; or 2) re-aligning at least one of the wafer tape or the substrate. Thus, in an embodiment, at least a first portion of the transfer mechanism coupled to or in contact with the needle or rod may be actuated in a second and/or third direction (e.g., along the X- or Y-direction) while a second portion of the transfer mechanism may be maintained in position (e.g., at a pivot location where the needle pivots about the pivot location). By adjusting the position of the first portion of the transfer mechanism along the X- or Y-direction, the needle or rod may be positioned at an angle (i.e., relative to the orientation in which the needle was previously actuated) and may be directed towards different die to actuate and drive multiple different die onto the substrate. In an embodiment, the transfer mechanism may be positioned using a gantry (or other conveyance mechanism that secures the transfer device) to move the transfer device into a first position, and from the first position, the needle may transfer a first die to a desired substrate by actuation thereof along a central axis of the needle. Following placement of the first die, the needle may be tilted (i.e., reoriented from the previous orientation via a rotational or pivotal motion) via the actuators, such that a second die, positioned adjacent or nearby the first die (within a contact distance of the needle), may also be transferred by the needle to the substrate. In this manner, depending on the relative proximity (spacing) of multiple die on a die carrying substrate, the multiple die may be transferred to the desired substrate before the gantry is moved and the entirety of the transfer mechanism re-positioned. Given the smaller size and fewer components involved with tilting of the transfer mechanism, as compared to moving the device gantry, the transfer of die may be performed more rapidly using the disclosed embodiments of a transfer system and methods than by conventional systems and methods.

In an embodiment, the gantry may cause the transfer mechanism to be in motion and may actuate the transfer mechanism while the gantry is in motion. In contrast, in conventional systems, the gantry may not be configured to, or even capable of, maintaining the transfer mechanism in motion while activating the transfer mechanism due to the changing position of the die and substrate as the gantry proceeds. However, according to an embodiment of the present disclosure, as the gantry moves along a first direction, the transfer needle may be tilted to actuate and drive the die onto the substrate, in the same first direction (i.e., leading or extending toward and out of a perpendicular position with respect to the first direction) and/or in a second direction different than the first direction (i.e., lateral to, trailing, or extending opposite and out of a perpendicular position with respect to the first direction behind). Moreover, the transfer described above may be executed without pausing the movement of the gantry during transfer. In an embodiment, the transfer mechanism may tilt at least a portion of the transfer mechanism based on a detected location of the die and the destination of the die on the substrate. In some aspects, the transfer mechanism (e.g., the needle) may be tilted during actuation to maintain alignment of the die, destination on the substrate, and the tip of the needle. The orientation of the needle during the actuation process may be determined using the known position of the transfer mechanism relative to the known position on the substrate where the die is to be affixed and/or where the die is transferred from. The determination of the orientation may be based on the relative positions, and may be determined using a line segment extending through the locations associated with 1) the needle, 2) the die on a transfer substrate, and 3) the transfer location on the final substrate. In this manner, the orientation of the needle may be determined by an orientation of a line segment connecting all three locations. Thus, the gantry may be capable of moving the transfer mechanism at higher rates than conventional systems and thereby increase die transfer rates onto the substrate. In an embodiment, the transfer mechanism may be tilted to an angle based on the direction the needle must be driven to attach the die to the substrate and may not tilt again until after the die is transferred.

In an embodiment, the conveyance mechanism or gantry may travel at a constant velocity and not come to a stop before transfer of the die from the wafer tape to the support substrate. In an embodiment, the conveyance mechanism may maintain a constant velocity as it passes though desired transfer locations. At a predetermined time, based at least in part on the transfer position, the system may actuate the actuators of the transfer mechanism to position the tip of the needle and/or maintain the position of the tip of the needle at the desired die to be transferred onto the substrate. At the instant that the die is properly positioned with respect to the needle and the transfer location, the transfer mechanism pushes the die, to be transferred into the transfer location on the substrate support. In an embodiment, the system may further include a fixing mechanism, depending on the use/situation/die to be transferred, to assist in fixing a transferred die to the support substrate, as described herein as an optional component for various embodiments of a die transfer system.

Additionally, in an embodiment, when the conveyance mechanism functions in continuous motion, at least a portion of the transfer mechanism may be rotated and/or tilted to ensure continual alignment of the tip of the transfer mechanism with respect to a die being transferred to a substrate positioned on the substrate conveyance mechanism. Accordingly, manufacturing efficiencies may be gained from minimizing the time otherwise added for waiting for system vibrations of the coarse conveyance mechanisms to settle at each transfer location. Additionally, the adjustments of the needle enable the constant velocity for the conveyance mechanism and/or other portions of the transfer mechanism, further increasing manufacturing efficiencies as the systems do not need to settle.

In an embodiment, as mentioned above, the transfer mechanism may be moved by the gantry along a first direction while the transfer mechanism may be tilted at various angles and directions, for example, to place die on a first side of the transfer mechanism as well as a second side of the transfer mechanism. The die may, for example, not be aligned along a direction of travel of the gantry or transfer mechanism and without requiring additional components to compensate for the alignment of the die. The tilt of the transfer mechanism may accommodate the mis- or un-aligned die to be placed. For example, if a die is misaligned or not aligned with a particular transfer location, the needle and/or components of the transfer mechanism may be oriented to direct the needle toward the die and the transfer location, thereby enabling compensation for such misalignments of the die with the transfer location.

Alternatively, or additionally, as mentioned briefly above, a system may optionally include a fixing mechanism to assist in affixing the separated, "unpackaged" die to the support substrate. In an embodiment, the support substrate may have thereon a circuit trace to which the die are transferred and affixed. The fixing mechanism may include a device that emits energy, such as a laser, to melt/soften the material of the circuit trace on the support substrate. Moreover, in an embodiment, the laser may be used to activate/harden the material of the circuit trace. Thus, the fixing mechanism may be actuated before, and/or after the die is in contact with the material of the circuit trace. Accordingly, in an optional embodiment, upon actuation of the transfer mechanism to release a die onto the support substrate, the energy emitting device may also be activated so as to prepare the trace material to receive the die. The activation of the energy emitting device may further enhance the release and capture of the die from the wafer tape so as to begin formation of a semiconductor product on the support substrate.

FIG. 1 illustrates an embodiment of an apparatus 100 that may be used to directly transfer unpackaged semiconductor components ("die") from a wafer tape to a support substrate. The wafer tape may also be referred to herein as the semiconductor device die substrate, die carrying substrate, or simply a die substrate. The apparatus 100 may include a support substrate conveyance mechanism 102 and a wafer tape conveyance mechanism 104. Each of the support substrate conveyance mechanism 102 and the wafer tape conveyance mechanism 104 may include a frame system or other means to secure the respective substrates to be conveyed to desired alignment positions with respect to each other.

The apparatus 100 may further include a transfer mechanism 106, which, as shown, may be disposed vertically above the wafer tape conveyance mechanism 104. In an embodiment, the transfer mechanism 106 may be located so as to nearly contact the wafer tape. The transfer mechanism 106 includes an actuation system 110 that performs actuation of the transfer mechanism 106 to drive a die from the wafer tape to the substrate (e.g., along a needle centered axis that may extend into a Z direction), the actuation system 110 includes actuators (e.g., linear actuators, rotary actuators, gear motors, piezoelectric transducers, etc.) to tilt the transfer mechanism 106 by actuating along an axis that also extends across the X- and/or Y-axis to align the transfer mechanism 106, die, and the target destination on the substrate. The tilt of the transfer mechanism, as used herein, refers to a changed orientation of the needle of the transfer mechanism, with the orientation of the needle positioned relative to a vertical direction (Z-axis). The tilt of the transfer mechanism enables the transfer mechanism to drive die onto a substrate in additional orientations and enables micro-adjustment of the transfer mechanism to resolve vibrations or movement within the system. The additional orientations enable die to be transferred to a substrate without moving an entire gantry system supporting the transfer mechanism, and in this manner, provides for increased speed and manufacturing efficiency in placing die on substrates.

Figure 2A:
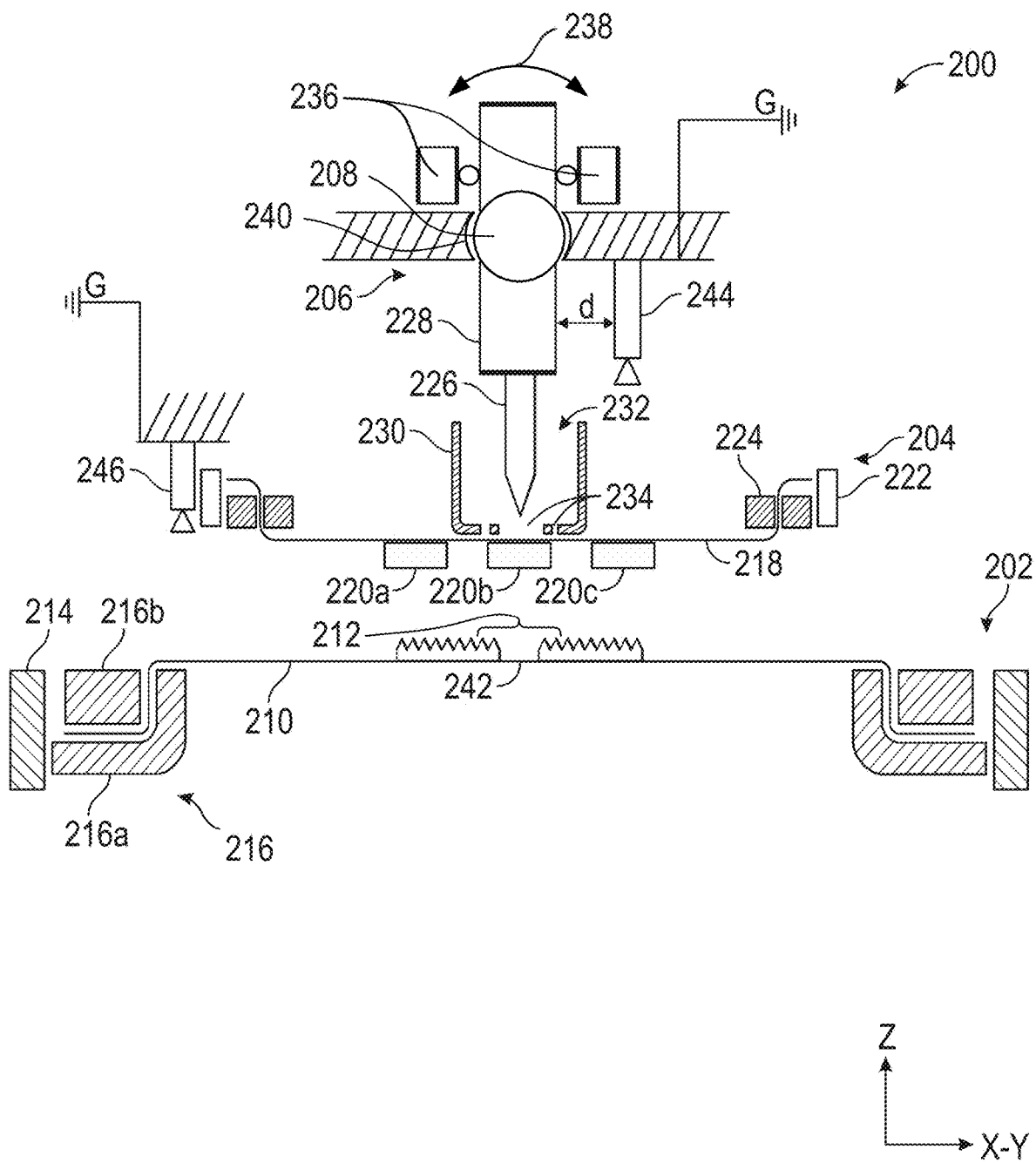
FIG. 2A illustrates a schematic view of an embodiment of a transfer apparatus in a pre-transfer position, according to this disclosure.
Figure 2B:
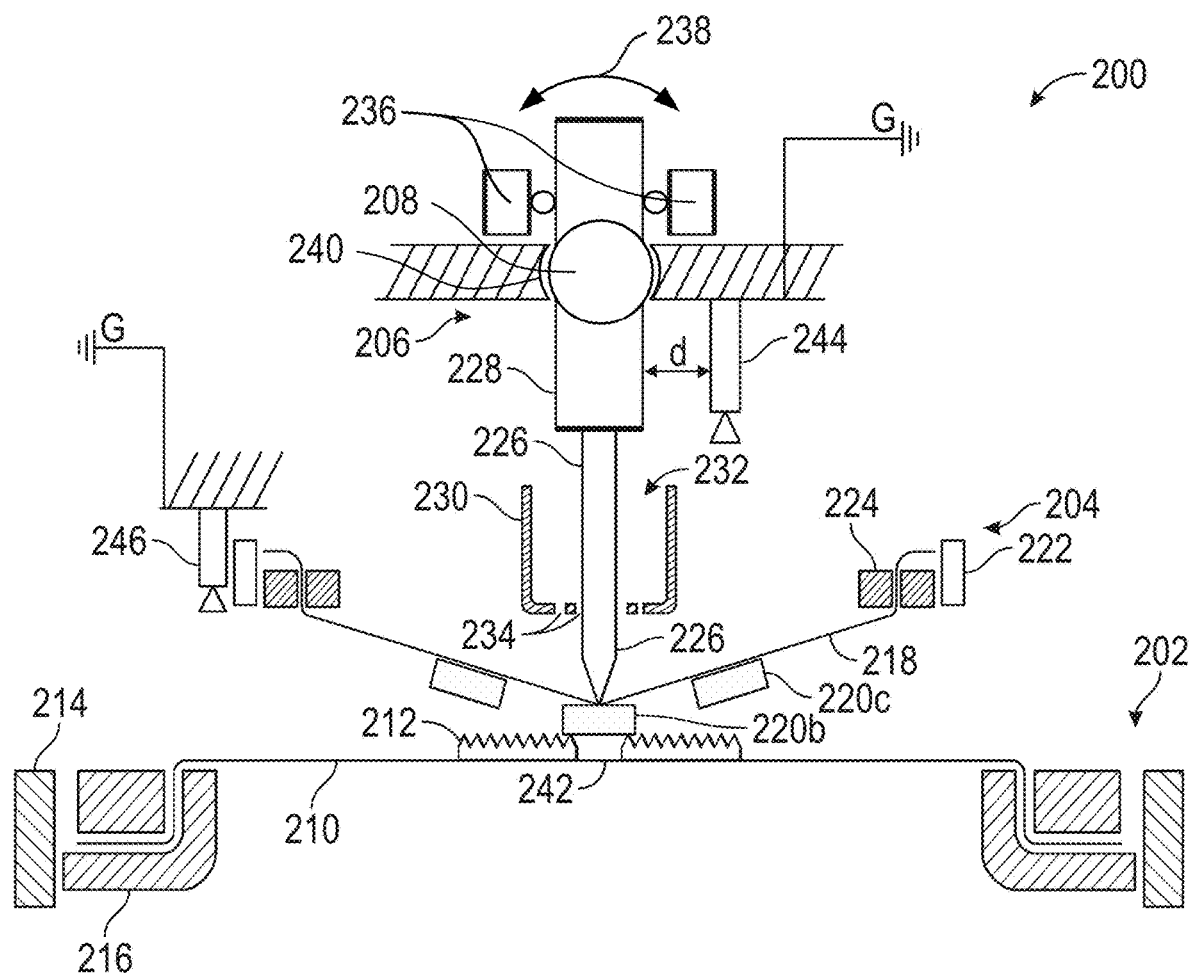
FIG. 2B illustrates a schematic view of an embodiment of a transfer apparatus in a transfer position, according to this disclosure.

Inasmuch as FIGS. 2A and 2B depict different stages of the transfer operation, while referring to the same elements and features of apparatus 200, the following discussion of specific features may refer interchangeably to either or both of FIGS. 2A and 2B, except where explicitly indicated. In particular, FIGS. 2A and 2B illustrate an embodiment of an apparatus 200, including a support substrate conveyance mechanism 202, a wafer tape conveyance mechanism 204, and a transfer mechanism 206. The support substrate conveyance mechanism 202 may be disposed adjacent to the wafer tape conveyance mechanism 204. For example, as illustrated, the support substrate conveyance mechanism 202 may extend in a substantially horizontal direction and may be disposed vertically beneath the wafer tape conveyance mechanism 204 so as to take advantage of any effect that gravity may have in the transfer process. Alternatively, the support substrate conveyance mechanism 202 may be oriented so as to extend transversely to a horizontal plane.

During a transfer operation, the conveyance mechanisms 202, 204 may be positioned such that a space between a surface of a support substrate carried by the support substrate conveyance mechanism 202 and a surface of a wafer tape carried by the wafer tape conveyance mechanism 204 may be more or less than 1 mm, depending on various other embodiments of the apparatus 200, including the amount of deflection that occurs by components during the transfer operation, as described herein below. In an embodiment, the respective opposing surfaces of the wafer tape and the support substrate may be the most prominent structures in comparison to the supporting structures of the conveyance mechanisms 202, 204. That is, in order to avoid a collision between components of the machine and products thereon, which might be caused by movable parts (e.g., the conveyance mechanisms 202, 204), a distance between the respective surfaces of the wafer tape and support substrate may be less than a distance between either of the surfaces and any other opposing structural component.

As depicted, and in an embodiment, the transfer mechanism 206 may be disposed vertically above the wafer tape conveyance mechanism 204. It is contemplated that in some embodiments, the transfer mechanism 206 may be oriented in different positions than the positions illustrated in FIGS. 2A and 2B. For example, the transfer mechanism 206 may be disposed so as to extend at an acute angle with respect to a horizontal plane.

The transfer mechanism 206 includes a needle 226, discussed in further detail below, that is used to transfer one or more die 220 from the wafer tape 218 to the substrate 210. The transfer mechanism 206 includes components for driving the needle 226 and also includes components for steering and guiding the needle 226. For example, as illustrated in FIG. 2A, the needle 226 is driven by a needle actuator 228 and is steered via a pivot 208 and a steering actuator 236. The needle actuator 228 serves to drive the needle 226 along the Z-axis as pictured in FIG. 2A. The steering actuator 236 serves to adjust a tilt or angle of the needle 226 to cause the needle 226 to advance in a direction other than vertical (e.g., along a needle centered axis that can extend into a Z-direction of the system). The needle 226 is rotationally coupled at the pivot 208, with the pivot 208 shown as a ball within a socket 240 of the transfer mechanism 206. Other pivotal connections (e.g., turntable, system of tracks and rails, etc.) are envisioned that enable pivoting of the needle 226 in response to actuation by the steering actuator 236. The steering actuator 236 may include mechanical, electromechanical, and other such actuation components to change a position of a rear portion of the needle 226 and/or the needle actuator 228 to cause a change in the angle of the needle 226 as the needle 226 is fixed horizontally (X-Y) at the pivot 208. Accordingly, the needle 226 may be directed by changing the rear end of the needle 226 along direction 238 (including in and out of the page of FIG. 2A) by use of the steering actuator 236.

The steering actuator 236 may include components aligned with the X- and Y-axis, which are therefore perpendicular to one another. By actuating the X- and Y-components of the steering actuator 236, the needle 226 may be tilted within a large range of angles with respect to the Z-axis, for example, in a range of zero to seventy degrees. In an embodiment, as discussed above, the needle 226 may be tilted to be directed towards a die 220 other than a die 220 positioned directly beneath the transfer mechanism 206. In an embodiment, as shown in FIG. 2A, the needle 226 may be actuated to position the die 220b, the needle 226 may then be tilted by the steering actuator 236 to place the die 220a and 220c without requiring movement of the gantry or support system for the transfer mechanism 206. In this manner, die 220a-220c may be placed by the needle 226 faster than conventional methods due to elimination of the extra time to adjust the position of the gantry or support structure, including the time to wait for the support structure to settle after moving positions and the pauses therebetween. In an embodiment, the steering actuator 236 may be positioned below the pivot 208, with the action similar to described above, with a different structural arrangement.

In an embodiment, the needle 226 may be used to drove the die 220a and/or 220c onto the substrate 210 without repositioning the transfer mechanism 206 using a supporting structure (such as a gantry). From the position of the transfer mechanism 206 shown in FIG. 2A, the needle 226 can be used in a vertical orientation (e.g., parallel to a Z-axis) to drive the die 220b towards the substrate 210. The needle 226 can be oriented (e.g., tilted), using the steering actuator 236, such that the needle 226 can drive the die 220a and/or 220c towards the substrate 210. In conventional systems, the transfer mechanism must be entirely re-positioned to enable such transfers, while in the embodiment shown in FIG. 2A, the transfer mechanism 206 can remain stationary while multiple die 220 are positioned on the substrate 210. In an embodiment, the substrate 210 may be moved to align the transfer locations for the die 220a and/or 220c with the orientation of the needle 226 as well, to further aid in accurate placement of die on the substrate 210.

In an embodiment described with respect to a variation of use of the system, the transfer mechanism 206 may be in motion in a plane parallel with the X-Y plane having a constant velocity with the needle 226 used to position die 220. The fine placement of the die 220 may be accomplished using the steering actuator 236 to position the die 220 while the transfer mechanism 206 is in motion, for example, to position a die 220 that needs to be placed on the substrate 210 outside of a narrow path directly underneath the transfer mechanism 206.

The support substrate conveyance mechanism 202 may be used to secure a support substrate 210. Herein, the term "support substrate" may include, but is not limited to: a wafer tape (for example, to presort the die and create sorted die sheets for future use); a paper or polymer substrate formed as a sheet or other non-planar shape, where the polymer—translucent or otherwise—may be selected from any suitable polymers, including, but not limited to, a silicone, an acrylic, a polyester, a polycarbonate, etc.; a circuit board (such as a printed circuit board (PCB)); a string or thread circuit, which may include a pair of conductive wires or "threads" extending in parallel; and a cloth material of cotton, nylon, rayon, leather, etc. The choice of material of the support substrate may include durable materials, flexible materials, rigid materials, and other materials with which the transfer process is successful, and which maintain suitability for the end use of the support substrate. The support substrate 210 may be formed solely or at least partially of conductive material such that the support substrate 210 acts as a conductive circuit for forming a product. The potential types of support substrate may further include items, such as glass bottles, vehicle windows, or sheets of glass.

In an embodiment as depicted in FIGS. 2A and 2B, the support substrate 210 may include a circuit trace 212 disposed thereon. The circuit trace 212, as depicted, may include a pair of adjacent trace lines spaced apart by a trace spacing, or gap so as to accommodate a distance between electrical contact terminals (not shown) on the die being transferred. Thus, the trace spacing, or gap between the adjacent trace lines of the circuit trace 212 may be sized according to the size of the die being transferred to ensure proper connectivity and subsequent activation of the die. For example, the circuit trace 212 may have a trace spacing, or gap ranging from about 75 to 200 microns, about 100 to 175 microns, or about 125 to 150 microns.

The circuit trace 212 may be formed from a conductive ink disposed via screen printing, inkjet printing, laser printing, manual printing, or other printing means. Further, the circuit trace 212 may be pre-cured and semi-dry or dry to provide additional stability, while still being activatable for die conductivity purposes. A wet conductive ink may also be used to form the circuit trace 212, or a combination of wet and dry ink may be used for the circuit trace 212. Alternatively, or additionally, the circuit trace 212 may be preformed as a wire trace, or photo-etched, or from molten material formed into a circuit pattern and subsequently adhered, embedded, or otherwise secured to the support substrate 210.

The material of the circuit trace 212 may include, but is not limited to, silver, copper, gold, carbon, conductive polymers, etc. In an embodiment, the circuit trace 212 may include a silver-coated copper particle. A thickness of the circuit trace 212 may vary depending on the type of material used, the intended function and appropriate strength or flexibility to achieve that function, the energy capacity, the size of the LED, etc. For example, a thickness of the circuit trace may range from about 5 microns to 20 microns, from about 7 microns to 15 microns, or from about 10 microns to 12 microns.

Accordingly, in an embodiment, the support substrate 210 may be a flexible, translucent polyester sheet having a desired circuit pattern screen printed thereon using a silver-based conductive ink material to form the circuit trace 212.

The support substrate conveyance mechanism 202 may include a support substrate conveyor frame 214 for securing a support substrate holder frame 216. The structure of the support substrate holder frame 216 may vary significantly depending on the type and properties (e.g., shape, size, elasticity, etc.) of the support substrate being used. Inasmuch as the support substrate 210 may be a flexible material, support substrate 210 may be held under tension in the support substrate holder frame 216, so as to create a more rigid surface upon which a transfer operation, discussed herein below, is performed. In the above embodiment, the rigidity created by the tension in the support substrate 210 may increase the placement accuracy when transferring components.

In an embodiment, using a durable or more rigid material for the support substrate 210, naturally provides a firm surface for component placement accuracy. In contrast, when the support substrate 210 is allowed to sag, wrinkles and/or other discontinuities may form in the support substrate 210 and interfere with the pre-set pattern of the circuit trace 212, to the extent that the transfer operation may be unsuccessful.

While the means of holding the support substrate 210 may vary greatly, FIG. 2A illustrates an embodiment of a support substrate holder frame 216 including a first portion 216a having a concave shape and a second portion 216b having a convex counter shape that corresponds in shape to the concave shape. In the depicted embodiment, tension is created for the support substrate 210 by inserting an outer perimeter of the support substrate 210 between the first portion 216a and the second portion 216b to thereby clamp the support substrate 210 tightly.

The support substrate conveyor frame 214 may be conveyed in at least three directions—two directions in the horizontal plane and vertically as well. The conveyance may be accomplished via a system of motors, rails, and gears (none of which are shown). As such, the support substrate holder frame 216 may be conveyed to and held in a specific position as directed and/or programmed and controlled by a user of the apparatus 200.

The wafer tape conveyance mechanism 204 may be implemented to secure a wafer tape 218 having die 220 (i.e., semiconductor device die) thereon. The wafer tape 218 may be conveyed in multiple directions to the specific transfer positions for the transfer operation via a wafer tape conveyor frame 222. It is contemplated that the wafer tape 218 may be conveyed by the wafer tape conveyance mechanism 204 at the same time the needle 226 is tilted to continued alignment and positioning of additional die from a single transfer mechanism 206 position. Similar to the support substrate conveyor frame 214, the wafer tape conveyor frame 222 may include a system of motors, rails, and gears (none of which are shown).

The unpackaged semiconductor die 220 for transfer may be extremely small. Indeed, the height of the die 220 may range from 12.5 to 200 microns, or from 25 to 100 microns, or from 50 to 80 microns. Due to the micro size of the die, when the wafer tape 218 has been conveyed to the appropriate transfer position, a gap spacing between the wafer tape 218 and the support substrate 210 may range from about 0.25 mm to 1.50 mm, or about 0.50 mm to 1.25 mm, or about 0.75 mm to 1.00 mm, for example. A minimum gap spacing may depend on factors including: a thickness of the die being transferred, a stiffness of the wafer tape involved, an amount of deflection of the wafer tape needed to provide adequate capture and release of the die, a proximity of the adjacent die, etc. As the distance between the wafer tape 218 and the support substrate 210 decreases, a speed of the transfer operation may also decrease due to the reduced cycle time (discussed further herein) of the transfer operation. Such a decrease in the duration of a transfer operation may therefore increase a rate of die transfers. For example, the die transfer rate may range from about 6-500 die placed per second per die transfer mechanism, therefore, with a second die transfer mechanism the die transfer rate may range from about 12 to about 1000 die placed per second.

Furthermore, the wafer tape conveyor frame 222 may secure a wafer tape holder frame 224, which may stretch and hold the wafer tape 218 under tension. As illustrated in FIG. 2A, the wafer tape 218 may be secured in the wafer tape holder frame 224 via clamping a perimeter of the wafer tape 218 between adjacent components of the wafer tape holder frame 224. Such clamping assists in maintaining the tension and stretched characteristic of the wafer tape 218, thereby increasing the success rate of the transfer operation. In view of the varying properties of different types/brands/qualities of wafer tapes available, a particular wafer tape may be selected for use based on an ability to consistently remain at a desired tension during a transfer process. In an embodiment, the needle actuation performance profile (discussed further herein below) may change depending on the tension of the wafer tape 218.

The material used for the wafer tape 218 may include a material having elastic properties, such as a rubber or silicone, for example. Furthermore, inasmuch as temperature of the environment and the wafer tape 218 itself may contribute to potential damage to the wafer tape 218 during the transfer process, a material having properties that are resistant to temperature fluctuation may be advantageous. Additionally, in an embodiment, the wafer tape 218 may be stretched slightly so as to create a separation or gap between individual die 220 to assist in the transfer operation. A surface of the wafer tape 218 may include a sticky substance via which the die 220 may be removably adhered to the wafer tape 218.

The die 220 on the wafer tape 218 may include die that were individually cut from a solid semiconductor wafer and then placed onto the wafer tape 218 to secure the die. In such a situation, the die may have been pre-sorted and explicitly organized on the wafer tape 218, in order, for example, to assist in the transfer operation. In particular, the die 220 may be arranged sequentially as to the expected order of transfer to the support substrate 210. Such pre-arrangement of the die 220 on the wafer tape 218 may reduce the amount of travel that would otherwise occur between the support substrate conveyance mechanism 202 and the wafer tape conveyance mechanism 204. Additionally, or alternatively, the die on the wafer tape 218 may have been pre-sorted to include only die having substantially equivalent performance properties. In this case, efficiency of the supply chain may be increased and thus, travel time of the wafer tape conveyance mechanism 204 may be reduced to a minimum.

In an embodiment, materials used for the die may include, but is not limited to, silicon carbide, gallium nitride, a coated silicon oxide, etc. Furthermore, sapphire or silicon may be used as a die as well. Additionally, as indicated above, a "die" may be representative herein of an electrically actuatable element generally.

In some embodiments, the wafer tape 218 may include die that are not pre-sorted, but rather are formed by simply cutting a semiconductor directly on wafer tape, and then leaving the die on the wafer tape without "picking and placing" to sort the die depending on the respective performance quality of the die. In such a situation, the die on the wafer tape may be mapped to describe the exact relative locations of the different quality die. Therefore, in an embodiment, it may be unnecessary to use wafer tape having pre-sorted die. In such a case, the amount of time and travel for the wafer tape conveyance mechanism 204 to move between particular die for each sequential transfer operation may increase. This may be caused in part by the varying quality of the die dispersed within the area of the semiconductor, which means that a die of a specific quality for the next transfer operation may not be immediately adjacent to the previously transferred die. Thus, the wafer tape conveyance mechanism 204 may move the wafer tape 218 further to align an appropriate die of a specific quality for transfer than would be necessary for a wafer tape 218 containing die of substantially equivalent quality.

In further regard to the die 220 on the wafer tape 218, in an embodiment, a data map of the die 220 may be provided with the wafer tape 218. The data map may include a digital file providing information that describes the specific quality and location of each die on the wafer tape 218. The data map file may be input into a processing system in communication with the apparatus 200, whereby the apparatus 200 may be controlled/programmed to seek the correct die 220 on the wafer tape 218 for transfer to the support substrate 210.

A transfer operation is performed, in part, via the transfer mechanism 206 as steered by the steering actuator 236, which is a die separation device for assisting in separation of die from the wafer tape 218. The actuation of the transfer mechanism 206 may cause one or more die 220 to be released from the wafer tape 218 and to be captured by the support substrate 210. In an embodiment, the transfer mechanism 206 may operate by pressing an elongated rod, such as the needle 226 into a top surface of the wafer tape 218 against a die 220. The needle 226 may be connected to the needle actuator 228. The needle actuator 228 may include a motor connected to the needle 226 to drive the needle 226 toward the wafer tape 218 at predetermined/programmed times. As discussed above, the needle 226 may be steered to drive die 220 from the wafer tape 218 to the substrate 210 even when the die 220 are not positioned directly underneath the transfer mechanism 206.

In an embodiment, the steering actuator 236 may pivot the needle actuator 228 in order for the needle 1126 to be able to transfer die 220 that are located within a certain range of the needle 226. For example, after transferring a die (e.g., die 220*b*) that is located directly beneath the needle 226 in an upright position, the steering actuator 236 may pivot the needle actuator 228 over a certain range. In an embodiment, by pivoting the needle actuator 228, the needle 226 may be configured to transfer die (e.g., the die 220*a* and 220*b*) without moving the support substrate conveyance mechanism 202, the wafter tape conveyance mechanism 204, and/or the transfer mechanism 206. In some instances, the needle 226 may be pivotable in a range of zero to five degrees, with the pivot location at or near an upper end of the needle 226. The needle may have a length from the pivot point to the tip of the needle 226 of 75 millimeters in an example, and in such examples, the pivot of the needle in a range of about 1 degree enables transfer of a die laterally misaligned by up to 1 millimeter. The pivot may enable the needle 226 to transfer die 220 up to 2.5 millimeters or more from a position directly below the needle 226. In a particular example, assuming a pivot distance of 75 millimeters from the pivot to the tip of the needle 226, the transfer mechanism 206 may place die at a rate of 100 die per second. At such a rate, the needle 226 moves in a down stroke to place the die for half of the cycle (e.g., 5 milliseconds). In the particular example, assuming a travel speed of the transfer mechanism 206 of 500 millimeters per second, the needle 226 may pivot 2.5 millimeters to place the die. In some examples, with the pivot at a different height, additional angles and distances may be possible, for example with double the pivot distance, the pivot angle to reach the laterally displaced die is reduced. In an embodiment, the needle actuator 228 may cause the needle 226 to advance varying distances based on the orientation of the needle 226. For example, in an embodiment where the needle is positioned in an upright position, the needle actuator 228 may extend the needle a first distance and subsequently, when the needle 226 is tilted at an angle relative to the upright position, the needle actuator 228 may cause the needle 226 to advance a second distance, greater than the first distance. The second distance may be greater as a result of the needle 226 being required to travel farther to reach a transfer location when positioned at a tilted orientation. For example, in a situation where die are being deposited on a substrate at a constant velocity (e.g., a constant transfer mechanism velocity with respect to the substrate), the lateral speed of the transfer mechanism is a factor in the lateral angle for the travel of the needle. In situations with a greater lateral speed, a greater angular position for the needle may be needed to compensate for the speed of the transfer mechanism while maintaining the rate of die transfer.

In view of the function of the needle 226, the needle 226 may include a material that is sufficiently durable to withstand repetitive, rapid, minor impacts while minimizing potential harm to the die 220 upon impact. For example, the needle 226 may include a metal, a ceramic, a plastic, etc. Additionally, a tip of the needle 226 may have a particular shape profile, which may affect the ability of the needle to function repetitively without frequently breaking either the tip or damaging the wafer tape 218 or the die 220. The profile shape of the tip of the needle 226 is discussed in greater detail below with respect to FIG. 3.

In a transfer operation, the needle 226 may be aligned with a die 220 using the needle actuator 228 and/or a gantry system that may position the transfer mechanism 206, as depicted in FIG. 2A, and the needle actuator 228 may move the needle 226 to push against an adjacent side of the wafer tape 218 at a position in which the die 220 is aligned on the opposing side of the wafer tape 218, as depicted in FIG. 2B. The pressure from the needle 226 may cause the wafer tape 218 to deflect so as to extend the die 220 to a position closer to the support substrate 210 than adjacent die 220, which are not being transferred. As indicated above, the amount of deflection may vary depending several factors, such as the thickness of the die and circuit trace. For example, where a die 220 is about 50 microns thick and circuit trace 212 is about 10 microns thick, an amount of deflection of the wafer tape 218 may be about 75 microns. Thus, the die 220 may be pressed via the needle 226 toward the support substrate 210 to the extent that the electrical contact terminals (not shown) of the die are able to bond with the circuit trace 212, at which point, the transfer operation proceeds to completion and the die 220 is released from the wafer tape 218.

In an embodiment, the transfer mechanism 206 may further include a support 230, (also known as a pepper pot). In an embodiment, the support 230 may include a structure having a hollowed space wherein the needle 226 may be accommodated by passing into the space via an opening 232 in a first end of the support 230. The opening 232 may act as a guide for the needle 226 in an embodiment. The support 230 may further include at least one opening 234 on a second opposing end of the support 230. Moreover, the support may include multiple perforations near opening 234. The at least one opening 234 may be sized with respect to a diameter of the needle 226 to accommodate passage of the needle 226 therethrough so as to press on the wafer tape 218 during the transfer process.

In an embodiment, the opening 234 may be positioned using one or more actuators (not shown) coupled to the support 230. The opening 234 may be driven in response to the steering actuator 236, for example to accommodate the needle 226 being at an angle other than vertical. In an embodiment, the support 230 may be actuated in a direction opposite from the rear of the needle 226 such that the opening 234 is aligned with a drive axis of the needle 226 as the needle 226 is tilted.

In an embodiment, the steering actuator 236 may be coupled to the support 230 and steering of the needle 226 may be accomplished by adjusting the position of the support 230 and the corresponding opening 234. The needle 226 tilts at the pivot 208 based on the driving of the support 230 and tip of the needle 226. In an embodiment, the opening 234 may include a bushing or other low-friction surface that contacts the needle 226 to reduce slop in the movement of the needle 226.

Additionally, in an embodiment, the support 230 may be disposed adjacent to the upper surface of the wafer tape 218. As such, when the needle 226 is retracted from pressing on the wafer tape 218 during a transfer operation, a base surface of the support 230 (having the at least one opening 234 therein) may come into contact with the upper surface of the wafer tape 218, thereby preventing upward deflection of the wafer tape 218. This upward deflection may be caused in the event where the needle 226 pierces at least partially into the wafer tape 218, and while retracting, the wafer tape is stuck to the tip of the needle 226. Thus, the support 230 may reduce the time it takes to move to the next die 220. A wall perimeter shape of the support 230 may be cylindrical or any other shape that may be accommodated in the apparatus 200. Accordingly, the support 230 may be disposed between the needle 226 and an upper surface of the wafer tape 218.

With respect to the effect of temperature on the integrity of the wafer tape 218, it is contemplated that a temperature of support 230 may be adjusted so as to regulate the temperature of the needle 226 and the wafer tape 218, at least near the point of the transfer operation. Accordingly, the temperature of the support 230 may be heated or cooled, and a material of the support 230 may be selected to maximize thermal conductivity. For example, the support 230 may be formed of aluminum, or another relatively high thermal conductivity metal or comparable material, whereby the temperature may be regulated to maintain consistent results of the transfer operations. In an embodiment, air may be circulated within the support 230 to assist in regulating the temperature of a local portion of the wafer tape 218.

In addition to the above features, apparatus 200 may further include a first sensor 244, from which apparatus 200 receives information regarding the die 220 on the wafer tape 218. In order to determine which die is to be used in the transfer operation, the wafer tape 218 may have a bar code (not shown) or another identifier, which is read or otherwise detected. The identifier may provide die map data to the apparatus 200 via the first sensor 244.

As shown in FIGS. 2A and 2B, the first sensor 244 may be positioned near the transfer mechanism 206 (or the needle 226 specifically), spaced apart from the transfer mechanism 206 by a distance d, which may range from about 1-5 inches, so as to enhance the accuracy of location detection. In an alternative embodiment, first sensor 244 may be disposed adjacent the tip of the needle 226 in order to sense the exact position of the die 220 in real time. During the transfer process, the wafer tape 218 may be punctured and or further stretched over time, which may alter the previously mapped, and thus expected, locations of the die 220 on the wafer tape 218. As such, small changes in the stretching of the wafer tape 218 could add up to significant errors in alignment of the die 220 being transferred. Thus, real time sensing may be implemented to assist in accurate die location.

In an embodiment, the first sensor 244 may be able to identify the precise location and type of die 220 that is being sensed. This information may be used to provide instructions to the wafer tape conveyor frame 222 and/or the steering actuator 236 indicating the exact location to which the wafer tape 218 should be conveyed and/or the needle 226 should be tilted in order to perform the transfer operation. Sensor 244 may be one of many types of sensors, or a combination of sensor types to better perform multiple functions. Sensor 244 may include but is not limited to: a laser range finder, or an optical sensor, such as an embodiment of a high-definition optical camera having micro photography capabilities.

Moreover, in an embodiment, a second sensor 246 may also be included in apparatus 200. The second sensor 246 may be disposed with respect to the support substrate 210 so as to detect the precise position of the circuit trace 212 on the support substrate 210. This information may then be used to determine any positional adjustment needed to align the support substrate 210 with the transfer mechanism 206 so that the next transfer operation occurs in the correct location on the circuit trace 212. This information may further be relayed to the apparatus 200 to coordinate conveying the support substrate 210 and/or adjust the steering actuator 236 to a correct position, while simultaneously conveying instructions to the wafer tape conveyor frame 222 and/or the steering actuator 236. A variety of sensors are also contemplated for the second sensor 246 including optical sensors, such as an embodiment including a high-definition optical camera having micro photography capabilities.

FIGS. 2A and 2B further illustrate that the first sensor 244 and the second sensor 246 may be grounded. In an embodiment, the first sensor 244 and the second sensor 246 may all be grounded to the same ground (G), or alternatively, to a different ground (G).

Depending on the type of sensor used for the first sensor 244 and second sensor 246, the first or second sensors may further be able to test the functionality of transferred die. Alternatively, an additional tester sensor (not shown) may be incorporated into the structure of apparatus 200 to test individual die before removing the support substrate 210 from the apparatus 200.

Furthermore, in an embodiment, multiple independently-actuatable needles and/or optional fixing mechanisms may be implemented in a machine in order to transfer and fix multiple die at a given time. The multiple needles and/or optional fixing mechanisms may be independently movable within a three-dimensional space. Multiple die transfers may be done synchronously (multiple needles going down at the same time), or concurrently but not necessarily synchronously (e.g., one needle going down while the other is going up, which arrangement may balance better the components and minimize vibration). The multiple needles may each be controlled by separate steering actuators 236 such that the needles may perform transfer operations simultaneously in different directions. Control of the multiple needles may be coordinated to avoid collisions between the plurality of components.

Figure 3:
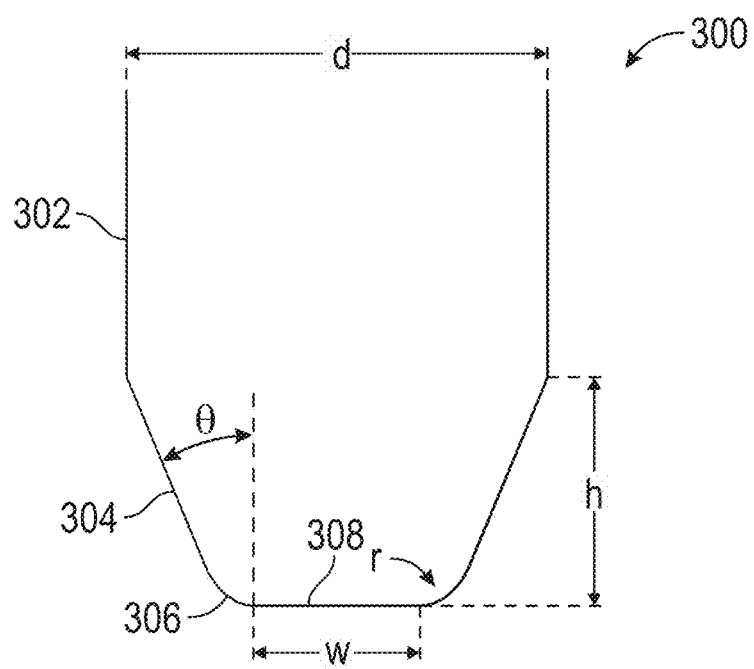
FIG. 3 illustrates an embodiment of a shape profile of the end of a needle of a transfer mechanism, according to this disclosure.

As mentioned above, a profile shape of the tip 300 of a needle is discussed with respect to FIG. 3, which shows a schematic example profile shape of the tip 300. The tip 300 may be a tip of a needle such as the needle 226 discussed above. In an embodiment, the tip 300 may be defined as the end of the needle, including sidewalls 302 adjoining tapered portion 304, corner 306, and base end 308, which may extend transversely to the opposing side of the needle. The specific size and shape of the tip 300 may vary according to factors of the transfer process such as, for example, the size of the die 220 being transferred and the speed and the impact force, of a transfer operation. For example, the angle θ seen in FIG. 3, as measured between a longitudinal direction of the central axis of the needle and the tapered portion 304 may range from about 10 to 15°; the radius r of the corner 306 may range from about 15 to 50+ microns; the width w of the base end 308 may range from about 0 to 100+ microns, where w may be less than or equal to the width of the die 220 being transferred; the height h of the tapered portion 304 may range from about 1 to 2 mm, where h may be greater than a distance traveled by needle during a stroke of a transfer operation; and the diameter d of the needle 226 may be approximately 1 mm.

Other needle tip profiles are contemplated and may have different advantages depending on various factors associated with the transfer operation. For example, the tip 300 may be blunter to mirror the width of the die or more pointed so as to press in a smaller area of the wafer tape. In an embodiment, the transfer mechanism 206 may implement two or more needles. In such an instance, the two or more needles may have a substantially similar needle profile, or they may have substantially different needle profiles. For example, the transfer mechanism 206 may include one or more needles 226 that have a needle tip profile as described and depicted with regard to FIG. 3. The transfer mechanism may further include one or more needles 226 that have a substantially different needle tip profile (i.e., wider than the depicted and described needle tip profile or narrower than the depicted and described needle tip profile). In an embodiment, the needle profile may not include any tapering to a point such that the needle 226 includes a constant width along an entire length of the needle 226.

Figure 4:
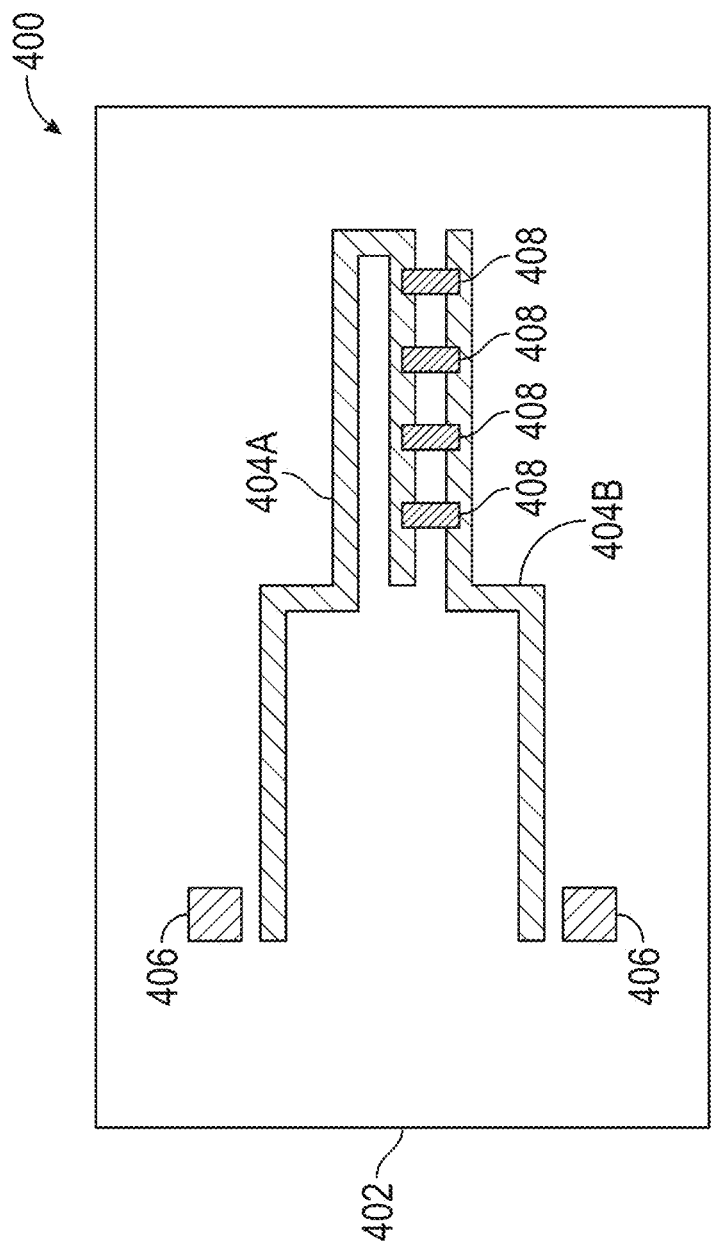
FIG. 4 illustrates a plan view of an embodiment of a product substrate having a circuit trace thereon, according to this disclosure.

FIG. 4 illustrates an embodiment of a processed support substrate 400. A support substrate 402 may include a first portion of a circuit trace 404A, which may perform as a negative or positive power terminal when power is applied thereto. A second portion of the circuit trace 404B may extend adjacent to the first portion of the circuit trace 404A and may act as a corresponding positive or negative power terminal when power is applied thereto.

As similarly described above with respect to the wafer tape, in order to determine where to convey the support substrate 402 to perform the transfer operation, the support substrate 402 may have a bar code (not shown) or other identifier, which is read or otherwise detected. The identifier may provide circuit trace data to the apparatus. The support substrate 402 may further include datum points 406. Datum points 406 may be visual indicators for sensing by the support substrate sensor (for example, second sensor 246 in FIG. 2) to locate the first and second portions of the circuit trace 404A, 404B. Once the datum points 406 are sensed, a shape and relative position of the first and second portions of the circuit trace 404A, 404B with respect to the datum points 406 may be determined based on preprogrammed information. Using the sensed information in connection with the preprogrammed information, the support substrate conveyance mechanism may convey the support substrate 402 to the proper alignment position for the transfer operation.

Additionally, die 408 are depicted in FIG. 4 as straddling between the first and second portions of the circuit trace 404A, 404B. In this manner, the electrical contact terminals (not shown) of the die 408 may be bonded to the support substrate 402 during a transfer operation. Accordingly, power may be applied to run between the first and second portions of the circuit trace 404A, 404B, and thereby powering die 408. For example, the die may be unpackaged LEDs that were directly transferred from a wafer tape to the circuit trace on the support substrate 402. Thereafter, the support substrate 402 may be processed for completion of the support substrate 402 and used in a circuit or other final product. Further, other components of a circuit may be added by the same or other means of transfer to create a complete circuit and may include control logic to control LEDs as one or more groups in some static or programmable or adaptable fashion.

Figure 5:
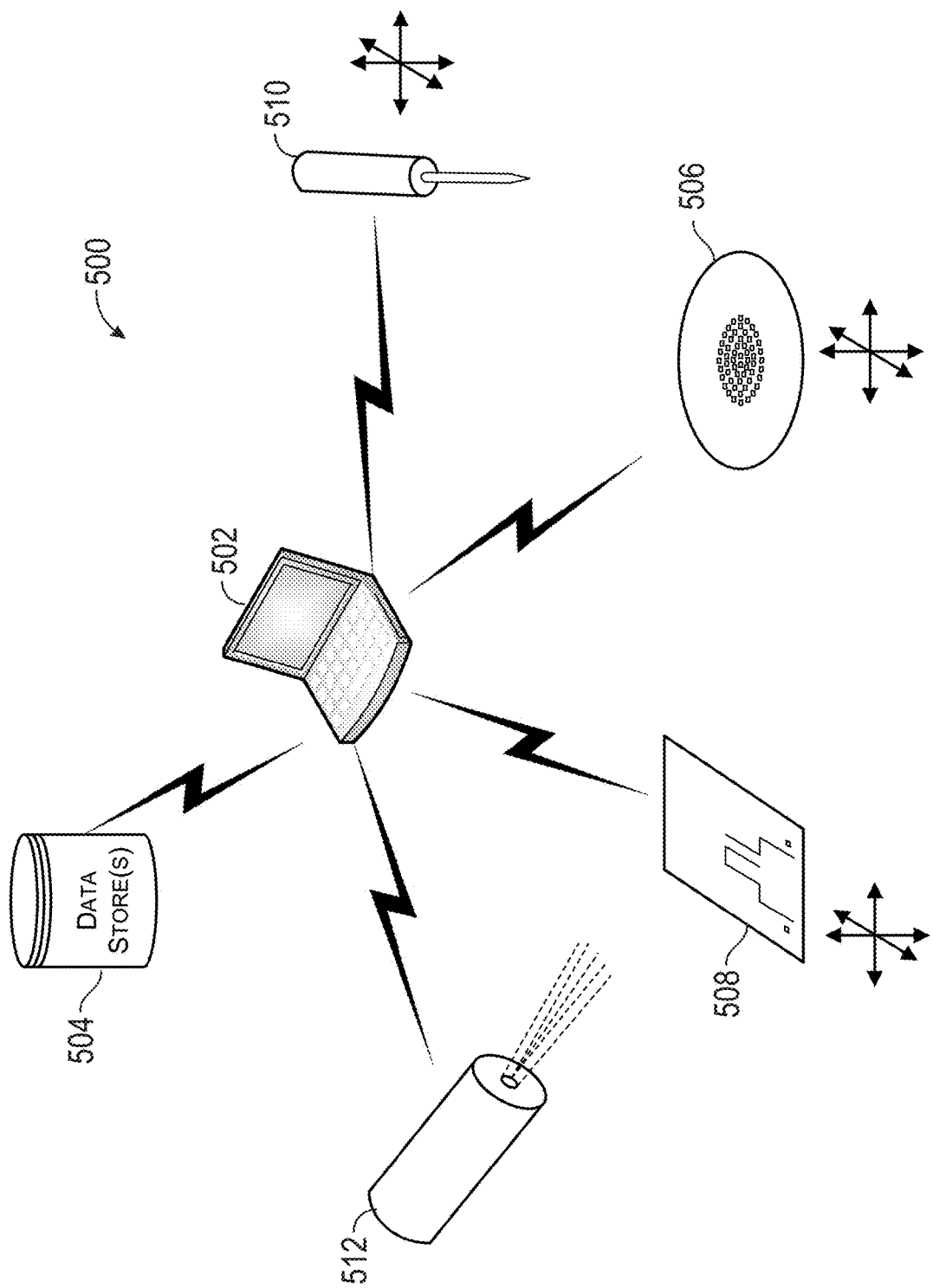
FIG. 5 illustrates a schematic view of an embodiment of elements of a die transfer system, according to this disclosure.

An embodiment of a transfer system 500 is illustrated in FIG. 5. The transfer system 500 may include a personal computer (PC) 502 (or server, data input device, user interface, etc.), a data store 504, a wafer tape mechanism 506, a support substrate mechanism 508, a transfer mechanism 510, and a fixing mechanism 512. Inasmuch as a more detailed description of the wafer tape mechanism 506, the support substrate mechanism 508, the transfer mechanism 510, and the fixing mechanism 512 has been given heretofore, specific details about these mechanisms is not repeated here. However, a brief description of how the wafer tape mechanism 506, the support substrate mechanism 508, the transfer mechanism 510, and the fixing mechanism 512 relate to interactions between the PC 502 and the data store 504 is described hereafter.

In an embodiment, the PC 502 communicates with data store 504 to receive information and data useful in the transfer process of directly transferring die from a wafer tape in wafer tape mechanism 506 using the transfer mechanism 510 on to a support substrate in the support substrate mechanism 508 whereat the die may be fixed upon the support substrate via actuation of a laser or other energy-emitting device located in the fixing mechanism 512. PC 502 may also serve as a receiver, compiler, organizer, and controller of data being relayed to and from each of the wafer tape mechanism 506, the support substrate mechanism 508, the transfer mechanism 510, and the fixing mechanism 512. PC 502 may further receive directed information from a user of the transfer system 500. As described above, control of the transfer mechanism 510 may include positioning of the transfer mechanism 510, angle or direction of the transfer mechanism 510, as well as actuation of the needle of the transfer mechanism 510 to perform a transfer operation. PC 502 may instruct the transfer mechanism to reposition, tilt, and actuate based on transfer locations and die locations on the wafer tape mechanism 506 and the support substrate mechanism 508.

Note that, while FIG. 5 depicts directional movement capability arrows adjacent to the wafer tape mechanism 506, the support substrate mechanism 508, and the transfer mechanism 510, those arrows merely indicate general directions for mobility, however, it is contemplated that the wafer tape mechanism 506, the support substrate mechanism 508, and the transfer mechanism 510 may also be able to move in other directions including rotation in plane, pitch, roll, and yaw, for example as discussed with respect to the transfer mechanism 206 of FIGS. 2A and 2B.

Figure 6:
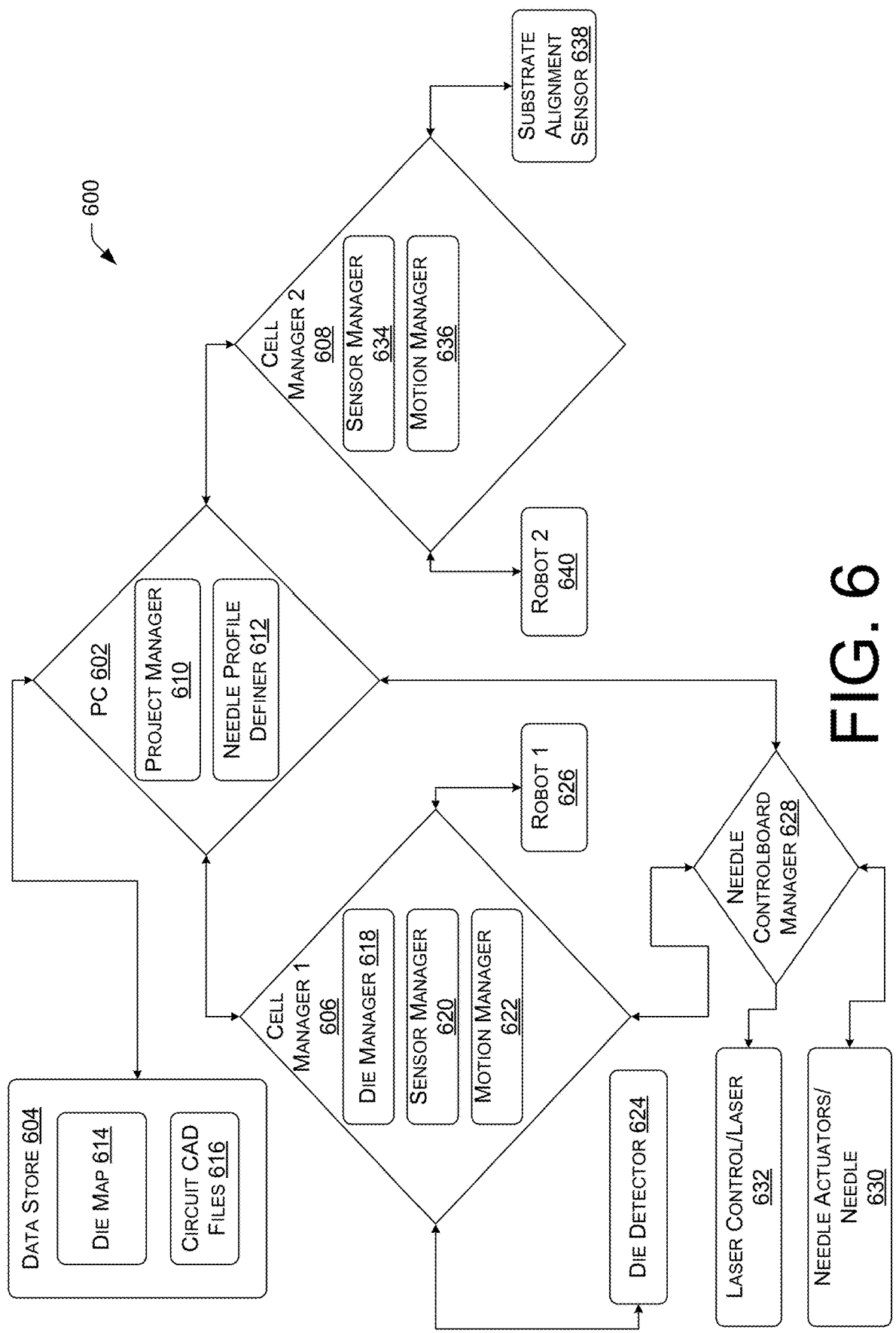
FIG. 6 illustrates a schematic view of an embodiment of a circuitry path between machine hardware and controllers of a die transfer system, according to this disclosure.

Additional details of the interaction of the components of the transfer system 500 are described with respect to FIG. 6 below.

A schematic of the communication pathways between the respective elements of a transfer system 600 may be described as follows.

The direct transfer system may include a personal computer (PC) 602 (or server, data input device, user interface, etc.), which may receive communication from, and provide communication to a data store 604. The PC 602 may further communicate with a first cell manager 606 (illustrated as "Cell Manager 1") and a second cell manager 608 (illustrated as "Cell Manager 2"). Therefore, the PC 602 may control and synchronize the instructions between the first cell manager 606 and the second cell manager 608.

PC 602 may include processors and memory components with which instructions may be executed to perform various functions with respect to the first and second cell managers 606, 608, as well as data store 604. In an embodiment, PC 602 may include a project manager 610 and a needle profile definer 612.

Project manager 610 may receive input from the first and second cell managers 606, 608 and data store 604 to organize the direct transfer process and maintain smooth functioning with respect to orientation and alignment of the support substrate with respect to the wafer tape and the die thereon.

Needle profile definer 612 may contain data regarding the needle stroke performance profile, which may be used to instruct the transfer mechanism regarding the desired needle stroke performance according to the specific die on the loaded wafer tape, the pattern of the circuit trace on the support substrate, and/or an orientation of the needle. Additional details of the needle profile definer 612 are discussed further herein below.

Turning back to data store 604, data store 604 may include memory containing data such as a die map 614, which may be specific to the wafer tape loaded in the wafer tape mechanism. As explained previously, a die map may describe the relative locations of each die on the wafer tape and the quality thereof for the purpose of providing a pre-organized description of the location of specific die. Further, data store 604 may also include memory containing circuit CAD files 616. Circuit CAD files 616 may contain data regarding a specific circuit trace pattern on the loaded support substrate.

Project manager 610 may receive the die map 614 and circuit CAD files 616 from the data store 604 and may relay the respective information to the first and second cell managers 606, 608, respectively.

In an embodiment, the first cell manager 606 may use the die map 614 from data store 604 via a die manager 618. More specifically, die manager 618 may compare die map 614 with the information received by a sensor manager 620, and based thereon, may provide instructions to a motion manager 622 regarding the location of a particular die. Sensor manager 620 may receive data regarding the actual location of die on the wafer tape from a die detector 624. Sensor manager 620 may also instruct the die detector 624 to look for a particular die in a particular location according to die map 614. The die detector 624 may include a sensor such as the second sensor 244 in FIGS. 2A and 2B. Based on the received data of the actual location (either a confirmation or an update regarding a shift in position) of the die on the wafer tape, the motion manager 622 may instruct a first robot 626 (illustrated as "Robot 1") to convey the wafer tape to an alignment position with the needle of the transfer mechanism.

Upon reaching the instructed location, the first robot 626 may communicate the completion of its movement to a needle controlboard manager 628. Additionally, the needle control board manager 628 may directly communicate with the PC 602 to coordinate the execution of the transfer operation. At the time of the execution of the transfer operation, the PC 602 may instruct the needle control board manager 628 to activate the needle actuators/needle 630, thereby causing the needle to perform a stroke in accordance with the loaded needle profile in the needle profile definer 612. As described above, the needle actuators may include actuators to steer or tilt the needle in addition to the actuators to drive the needle. In an embodiment, upon reaching the instructed location, the needle actuators may be controlled to place one or more die without moving the first robot 626. The needle controlboard manager 628 may also optionally activate a laser control/laser 632, thereby causing the laser to emit a beam toward the support substrate as the needle presses down a die via the wafer tape to execute the transfer operation. As indicated above, the optional activation of the laser control/laser 632 may occur prior to, simultaneously, during, or after activation, or even a complete actuation, of the needle stroke.

Accordingly, the first cell manager 606 may pass through a plurality of states including: determining where to tell the first robot 626 to go; telling the first robot 626 to go to the determined location; turning on the needle; activating the fixing device; and resetting.

Prior to execution of the transfer operation, the project manager 610 may relay the data of the circuit CAD files 616 to the second cell manager 608. The second cell manager 608 may include a sensor manager 634 and a motion manager 636. Using the circuit CAD files 616, the sensor manager 634 may instruct the substrate alignment sensor 638 to find the datum points on the support substrate and thereby detect and orient the support substrate according to the location of the circuit trace thereon. The sensor manager 634 may receive confirmation or updated location information of the circuit trace pattern on the support substrate. The sensor manager 634 may coordinate with the motion manager 636 to provide instructions to a second robot 640 (illustrated as "Robot 2") to convey the support substrate to an alignment position (i.e., a transfer fixing position) for execution of the transfer operation. Thus, the circuit CAD files 616 may assist the project manager 610 in aligning the support substrate with respect to the wafer tape such that the die may be accurately transferred to the circuit trace thereon.

Accordingly, the second cell manager 608 may pass through a plurality of states including: determining where to tell the second robot 640 to go; telling the second robot 640 to go to the determined location; and resetting.

It is understood that additional and alternative communication pathways between all or fewer than all of the various components of the transfer system 600 described above are possible.

Figure 7:
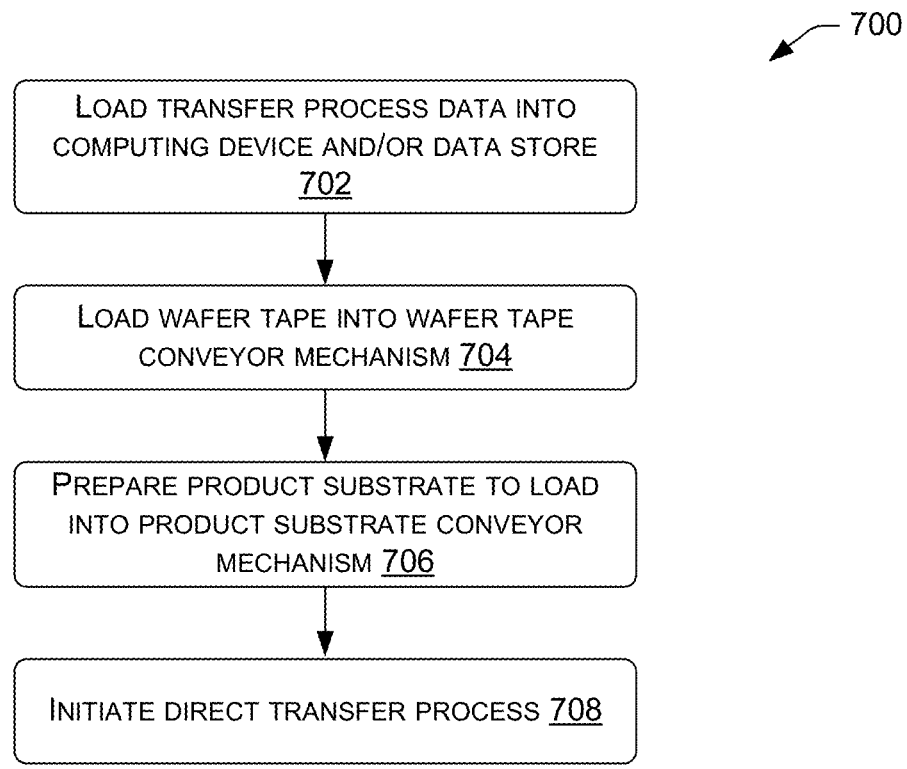
FIG. 7 illustrates a method of a die transfer process according to an embodiment of this disclosure.

A method 700 of executing a direct transfer process, in which one or more die is directly transferred from a wafer tape to a support substrate, is illustrated in FIG. 7. The steps of the method 700 described herein may not be in any particular order and as such may be executed in any satisfactory order to achieve a desired product state. The method 700 may include a step of loading transfer process data into a PC and/or a data store 702. The transfer process data may include data such as die map data, circuit CAD files data, and needle profile data.

A step of loading a wafer tape into a wafer tape conveyor mechanism 704 may also be included in method 700. Loading the wafer tape into the wafer tape conveyor mechanism may include controlling the wafer tape conveyor mechanism to move to a load position, which is also known as an extract position. The wafer tape may be secured in the wafer tape conveyor mechanism in the load position. The wafer tape may be loaded so that the die of the semiconductor is facing downward toward the support substrate conveyor mechanism.

The method 700 may further include a step of preparing the support substrate to load into the support substrate conveyor mechanism 706. Preparing the support substrate may include a step of screen printing a circuit trace on the support substrate according to the pattern of the CAD files being loaded into the PC or data store. Additionally, datum points may be printed onto the circuit substrate in order to assist in the transfer process. The support substrate conveyor mechanism may be controlled to move to a load position, which is also known as an extraction position, whereat the support substrate may be loaded into the support substrate conveyor mechanism. The support substrate may be loaded so that the circuit trace faces toward the die on the wafer. In an embodiment, for example, the support substrate may be delivered and placed in the load position by a conveyor (not shown) or other automated mechanism, such as in the style of an assembly line. Alternatively, the support substrate may be manually loaded by an operator.

Once the support substrate is properly loaded into the support substrate conveyor mechanism in the wafer tape is properly loaded into the wafer tape conveyor mechanism, a program to control the direct transfer of the die from the wafer tape to the circuit trace of the support substrate may be executed via the PC to commence the direct transfer operation 708. The details of the direct transfer operation are described below.

Example Direct Transfer Operation Method

Figure 8:
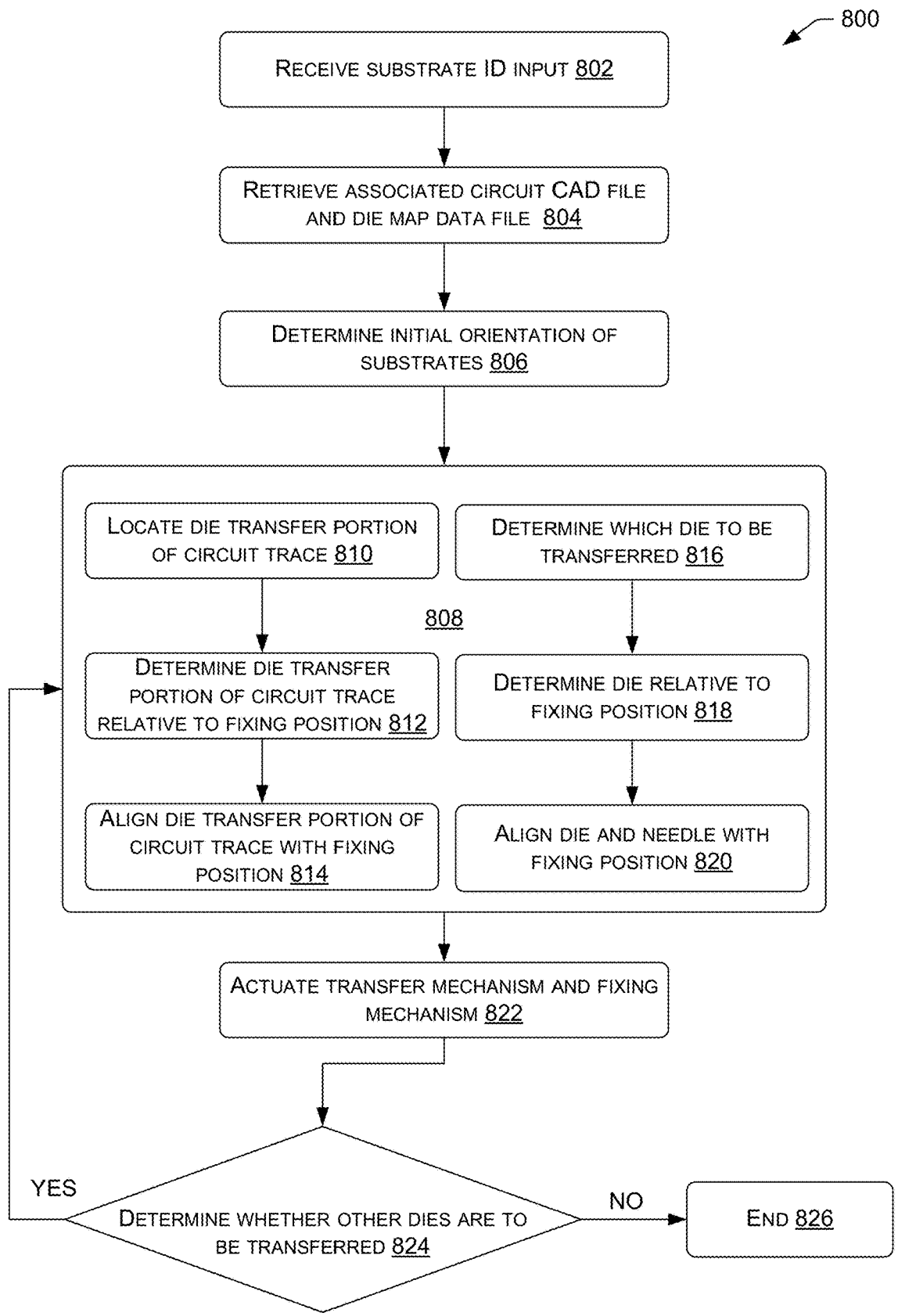
FIG. 8 illustrates a method of a die transfer operation according to an embodiment of this disclosure.

A method 800 of the direct transfer operation of causing die to be transferred directly from the wafer tape (or other substrate holding die, also called a "die substrate" for simplified description of FIG. 8) to the support substrate is illustrated in FIG. 8. The steps of the method 800 described herein may not be in any particular order and as such may be executed in any satisfactory order to achieve a desired product state.

In order to determine which die to place on the support substrate and where to place the die on the support substrate, the PC may receive input regarding the identification of the support substrate and the identification of the die substrate containing the die to be transferred 802. This input may be entered manually by a user, or the PC may send a request to the cell managers in control, respectively, of the support substrate alignment sensor and the die detector. The request may instruct the sensor to scan the loaded substrate for an identification marker, such as a barcode or QR code; and/or the request may instruct the detector to scan the loaded die substrate for an identification marker, such as a barcode or QR code.

Using the support substrate identification input, the PC may query the data store or other memory to match the respective identification markers of the support substrate and the die substrate and retrieve the associated data files 804. In particular, the PC may retrieve a circuit CAD file associated with the support substrate that describes the pattern of the circuit trace on the support substrate. The circuit CAD file may further contain data such as the number of, relative positions of, and respective quality requirement of, the die to be transferred to the circuit trace. Likewise, the PC may retrieve a die map data file associated with the die substrate that provides a map of the relative locations of the specific die on the die substrate.

In the process of executing a transfer of a die to the support substrate, the PC may determine the initial orientation of the support substrate and the die substrate relative to the transfer mechanism and the fixing mechanism. Within step 806, the PC may instruct the substrate alignment sensor to locate datum points on the support substrate. As discussed above, the datum points may be used as reference markers for determining the relative location and orientation of the circuit trace on the support substrate. Further, the PC may instruct the die detector to locate one or more reference points on the die substrate to determine the outlay of the die.

Once the initial orientation of the support substrate and die substrate are determined, the PC may instruct the respective support substrate and die substrate conveyance mechanisms to orient the support substrate and die substrate, respectively, into a position of alignment with the transfer mechanism and the fixing mechanism. Additionally, in an embodiment, once the initial orientation is determined, the PC may determine one or more positions and/or angles for the transfer mechanism to perform transfer operations while reducing or minimizing motion of the transfer mechanism. Reducing motion of the transfer mechanism, that is, reducing the number of locations the transfer mechanism will move to reduces the overall time to complete the transfers for a particular substrate and produces the efficiencies discussed above.

The alignment step 808 may include determining the location of the portion of the circuit trace to which a die is to be transferred at step 810, and where the portion is located relative to the transfer fixing position at step 812. The transfer fixing position may be considered to be the point of alignment between the transfer mechanism and the fixing mechanism. Based on the data determined in steps 810 and 812, the PC may instruct the support substrate conveyance mechanism to convey the support substrate so as to align the portion of the circuit trace to which a die is to be transferred with the transfer fixing position 814. In an embodiment, as described herein, the circuit trace and die may be aligned by changing the orientation of the transfer mechanism without adjusting the position of the transfer mechanism, which may be operated in a rapid manner to reduce time to transfer multiple die to the substrate before the transfer mechanism is moved. In an embodiment, based on a trajectory of the transfer mechanism, the alignment step may include determining die locations along the trajectory, including within a threshold range of the region directly underneath the needle, and may identify required angles for the needle to perform the die transfers while in motion. For example, the needle may be positionable to reach positions laterally offset from a position directly underneath the transfer mechanism of 700 micrometers in an X- and Y-direction (e.g., along the surface of the substrate) and may require a position angle of around 0.55 degrees with a 75 millimeter distance from the tip of the needle to the pivot location to achieve such distances. In some examples, the range may be extended up to and in excess of 2.5 millimeters with a 75 millimeter length at angles of around 2 degrees. In some examples, the angles achievable by the needle may be in a range of 0 to 5 degrees.

The alignment step 808 may further include determining which die on the die substrate will be transferred at step 816, and where the die is located relative to the transfer fixing position at step 818. Based on the data determined in steps 816 and 818, the PC may instruct the wafer tape conveyance mechanism to convey the die substrate so as to align the die to be transferred with the transfer fixing position 820.

Once the die to be transferred from the die substrate and the portion of the circuit trace to which a die is to be transferred are aligned with the transfer mechanism and the fixing mechanism, the needle and the fixing device (e.g., laser) may be actuated 822 to effectuate the transfer of the die from the die substrate to the support substrate. In an embodiment, the needle may be tilted to align the die and circuit trace location without moving the entire transfer mechanism. The angle may be determined based on the lateral motion required during a placement stroke. The angle may be determined based on a lateral speed of the transfer mechanism, a pitch of the die on the die substrate in millimeters, a die footprint pitch on the substrate in millimeters, a die placement rate, a working gap or distance between the die and product substrates. The positions of each of the components are tracked, encoded, and monitored in real-time by a controller that may adjust based on the die placement rate and/or other factors discussed herein.

After a die is transferred, the PC may determine whether additional die is to be transferred 824. In the case where another die is to be transferred, the PC may revert to step 808 and realign the product and die substrates accordingly for a subsequent transfer operation. In the case where there will not be another die transferred, the transfer process is ended 826.

Figure 9:
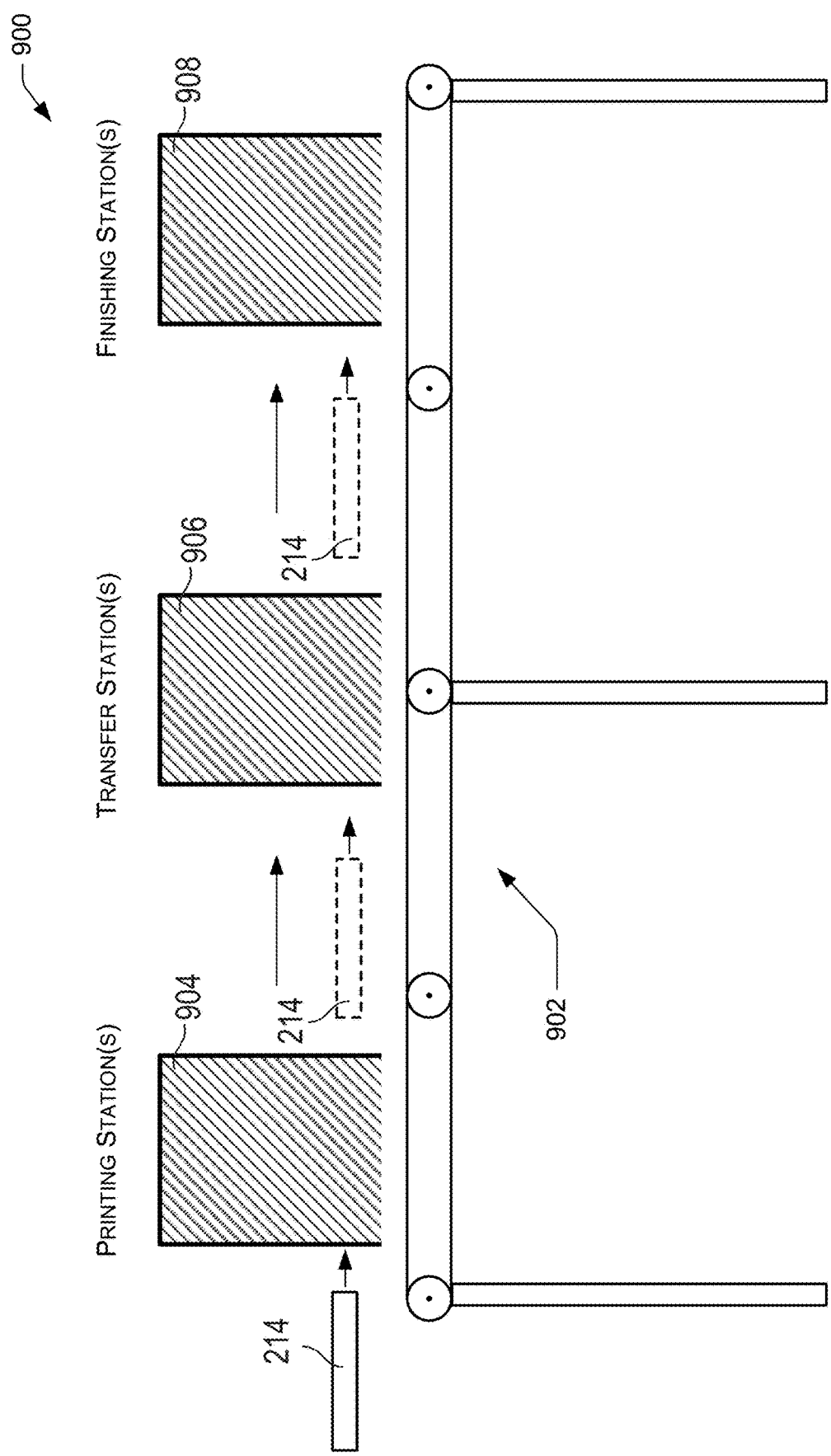
FIG. 9 illustrates an embodiment of a direct transfer apparatus and process implementing a conveyor system, according to this disclosure.

In an embodiment described with respect to FIG. 9, several of the components of the direct transfer apparatus described above may be implemented in a conveyor/assembly line system 900 (hereinafter "conveyor system 900"). In particular, FIGS. 2A and 2B depict the support substrate 210 being held by the support substrate conveyor frame 214 and tensioned by the support substrate holder frame 216. As an alternative to securing a support substrate conveyor frame 214 in a confined area via a system of motors, rails, and gear as indicated with respect to apparatus 200, FIG. 9 illustrates the support substrate conveyor frame 214 being conveyed through the conveyor system 900 in which the support substrate goes through an assembly line style process. As the actual means of conveyance between operations being performed on the support substrate being conveyed, the conveyor system 900 may include a series of tracks, rollers, and belts 902 and/or other handling devices to sequentially convey a plurality of support substrate conveyor frames 214, each holding a support substrate.

In an embodiment, operation stations of the conveyor system 900 may include one or more printing stations 904. As blank support substrates are conveyed to the printing station(s) 904, a circuit trace may be printed thereon. In the case that there are multiple printing stations 904, the multiple printing stations 904 may be arranged serially, and may be configured to perform one or more printing operations each so as to form a complete circuit trace.

Additionally, in the conveyor system 900, the support substrate conveyor frame 214 may be conveyed to one or more die transfer stations 906. In the event that there are multiple die transfer stations 906, the multiple die transfer stations 906 may be arranged serially and may be configured to perform one or more die transfers each. At the transfer station(s), the support substrates may have one or more die transferred and affixed thereto via a transfer operation using one or more of the direct transfer apparatus embodiments described herein. For example, each transfer station 906 may include a wafer tape conveyance mechanism, a transfer mechanism, and a fixing mechanism. In an embodiment, a circuit trace may have been previously prepared on the support substrate, and as such, the support substrate may be conveyed directly to the one or more transfer stations 906.

In the transfer stations 906, the wafer tape conveyance mechanism, the transfer mechanism, and the fixing mechanism may be aligned with respect to the conveyed support substrate conveyor frame 214 upon entering the station. In this situation, the transfer station 906 components may repeatedly perform the same transfer operation in the same relative position on each support substrate as the plurality of support substrates are conveyed through the conveyor system 900.

Moreover, the conveyor system 900 may further include one or more finishing stations 908 to which the support substrate may be conveyed to have final processing performed. The type, amount, and duration of the final processing may depend on the features of the product and the properties of the materials used to make the product. For example, the support substrate may receive additional curing time, a protective coating, additional components, etc., at the finishing station(s) 908.

Figure 10:
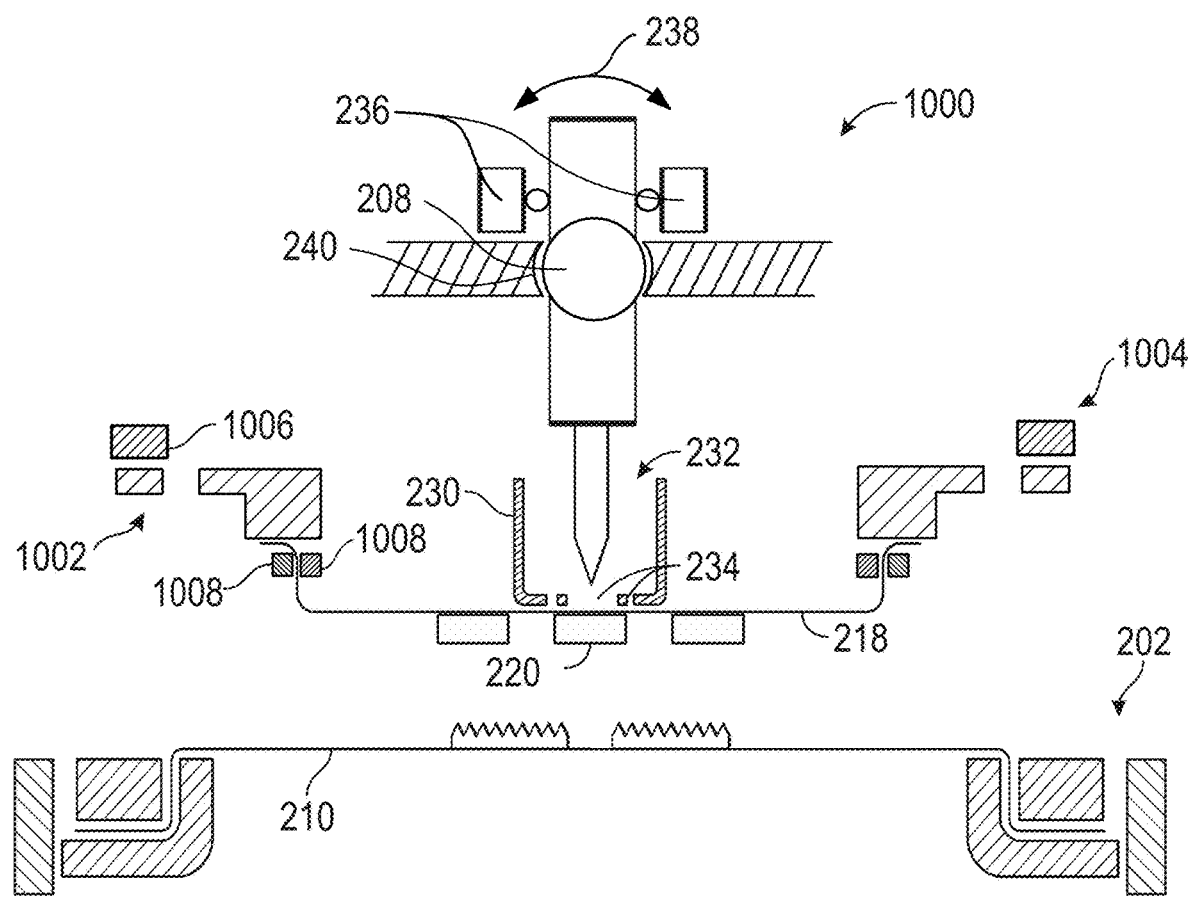
FIG. 10 illustrates a schematic view of an embodiment of a direct transfer apparatus, in a pre-transfer position, with a micro-adjustment assembly implemented according to this disclosure.

Illustrated in FIG. 10 is an embodiment of a direct transfer apparatus 1000. In the embodiment depicted, a micro-adjustment mechanism 1002 is attached to a wafer tape conveyance mechanism 1004, which may assist in the direct transfer of semiconductor device die 220 from a wafer tape 218 to a support substrate 210. While many features of the transfer apparatus 1000 may remain substantially similar to those of apparatus 200 in FIGS. 2A and 2B, some distinctions are discussed herein below with respect to FIG. 11 including the implementation of the micro-adjustment mechanism 1002 that makes micro adjustments (e.g., 5 microns to 50 microns, or 1 micron to 1000 microns, or 0.5 micron to 5000 microns, etc.) to the orientation and/or position of wafer tape 218 and die 220 during the die transfer process.

As an overview, the transfer apparatus 1000 may include the support substrate conveyance mechanism 202 (also depicted with respect to FIGS. 2A and 2B), and wafer tape conveyance mechanism 1004. The wafer tape conveyance mechanism 1004 is, in general, functionally similar to the wafer tape conveyance mechanism 204, as it includes a wafer tape conveyor frame 1006 and a wafer tape holder frame 1008. In general, support substrate conveyance mechanism 202 and the wafer tape conveyance mechanism 1004 may be discussed herein as mechanisms that provide "coarse movement," as they are generally moved for larger movements (relative to micro movements) between successive die transfer locations. However, as indicated above, the wafer tape conveyance mechanism 1004 in the embodiment of FIG. 10 includes micro-adjustment mechanism 1002, discussed in detail below. While the mechanisms that provide coarse movements may still be used to adjust between transfer locations on a smaller scale as needed, including a micro distance, it is considered that the coarse movement mechanisms are better suited for larger, macro movements (e.g., ~1-2 mm or greater). Thus, the implementation of a micro-adjustment mechanism in connection with a coarse movement conveyance mechanism may be advantageous for several situations. For example, a micro adjustment may be made in addition to a coarse movement when the coarse movement conveyance mechanism has overshot a transfer location, undershot a transfer location, or is shuddering near a transfer location due to stopping from a coarse movement, such that a transfer alignment is slightly off, e.g., on a micro scale.

The micro-adjustment mechanism 1002 may be used in conjunction with the steerable transfer mechanism to provide micro adjustments and alignment using only the micro adjustments of the micro-adjustment mechanism 1002 and the steering actuator 236. The steering actuator 236 and the micro-adjustment mechanism 1002 may provide for micro adjustments without requiring movement or adjustment of the coarse mechanisms of the transfer device, thereby increasing die transfer speed and efficiency as the micro adjustments may be performed in a more rapid and less mechanically disruptive manner than the coarse adjustments.

The micro-adjustment mechanism 1002 and the steering actuator 236, in conjunction with cell manager 606 (FIG. 6), may perform real-time micro-adjustments that align and/or more closely align the support substrate 210, the die 220, and the needle 226 during the die transfer process. In an embodiment, the transfer apparatus 1000 may perform micro-adjustments for different purposes, including compensating for vibrational movement after stopping a moving component, and/or for the purpose of speeding overall die transfer operations in which the motion speed of conveyance mechanisms 202, 1004 is slowed before a subsequent die transfer (instead of a full stop at each transfer operation).

For example, in an embodiment, the micro-adjustment mechanism 1002 corrects positional errors caused by vibration from starting and/or stopping conveyance of the wafer tape conveyor frame 1006. The die transfer rate may range from about 6-450 die or more placed per second. In general, as the transfer rate increases, the mechanical complexity and weight of the conveyance apparatus may increase as well. The increases in the speed of moving masses and the increases in transfer rate may collectively add system component vibrations when those masses accelerate quickly and then come to an abrupt stop. The settling time required to dissipate the vibrations may create time-related inefficiencies in die transfer. In an embodiment, micro-adjustment of the wafer tape holder frame 1008 may increase system efficiency by counteracting vibrations, which affect the relative position of the die, to reduce or eliminate settling time of the wafer tape conveyance mechanism 1004. Additionally, in an embodiment, the needle 226 with the steering actuator 236 may be used either in conjunction with or in place of the micro-adjustment mechanism to provide the micro-adjustment benefits described above. For example, the steering actuator 236 may be used to counteract and correct positional errors such as described above.

In an embodiment, micro-adjustments may be made to increase system efficiency by allowing the wafer tape conveyance mechanism 1004 to remain continually in motion and transfer the die 220 to the support substrate 210 while the wafer tape holder frame 1008 is still in motion, without repeated starts and stops as the wafer tape conveyance mechanism 1004 travels from one transfer location to the next transfer location.

In an embodiment, as the frame holding the wafer tape is conveyed from location to location, the conveyance mechanism holding the wafer frame may move to the transfer location, and after coming to an abrupt stop or even slowing significantly, a micro-adjustment by the steering actuator 236 and/or the micro-adjustment mechanism 1002 that finetunes the transfer location and/or removes system vibrations may be performed. Once adjusted, the system then transfers the die.

Figure 11:
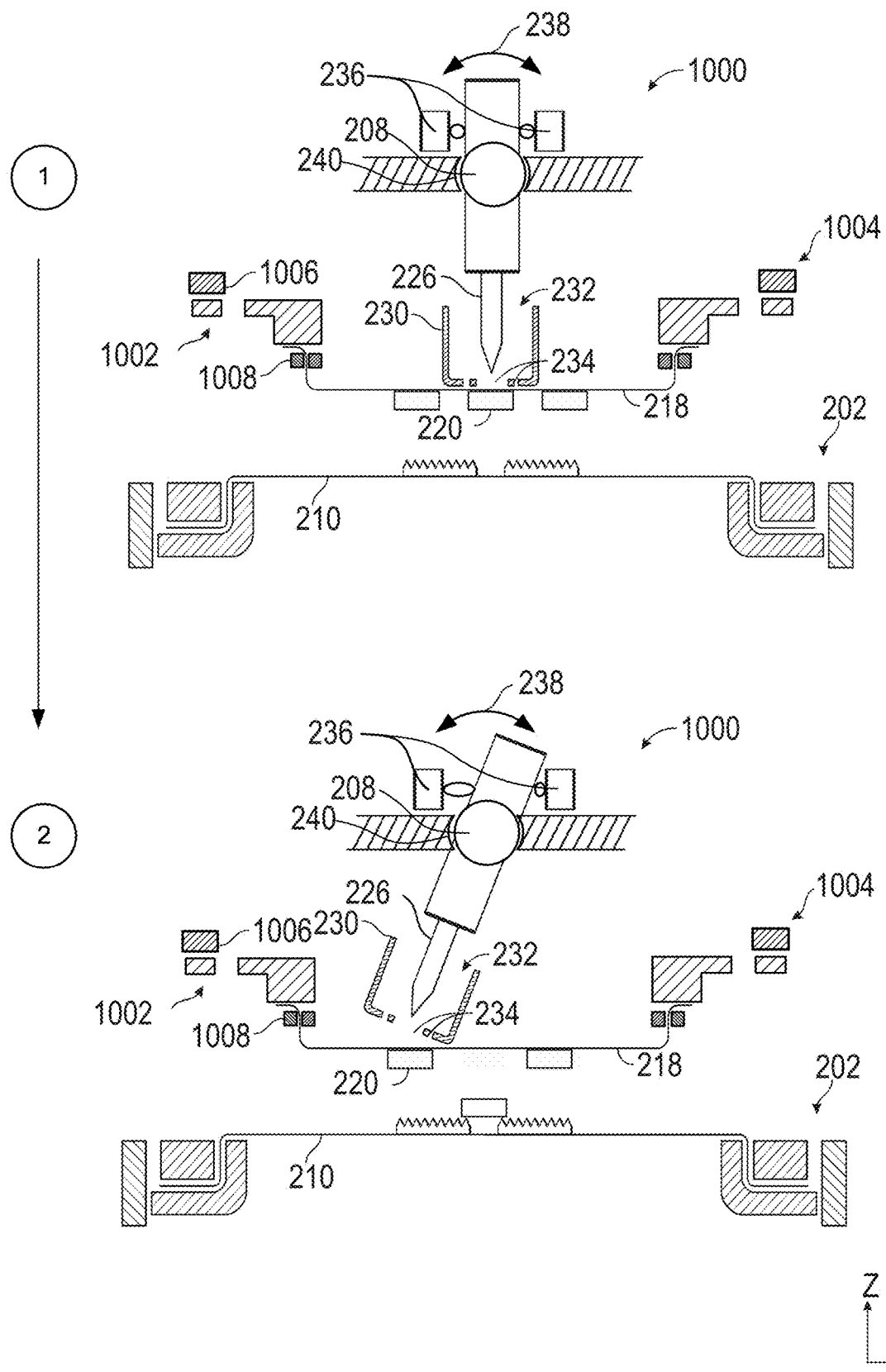
FIG. 11 illustrates a schematic view of an embodiment of elements of a die transfer system showing a tilting transfer mechanism, according to this disclosure.

FIG. 11 illustrates a schematic view of an embodiment of elements of a transfer apparatus 1000 showing a tilting transfer mechanism, according to this disclosure. The transfer apparatus 1000 is shown and described with respect to FIG. 10 above. Though shown and described with respect to the embodiment of FIG. 10, the tilting transfer mechanism may be used in connection with other embodiments described herein.

At the first stage of FIG. 11, the transfer apparatus 1000 is shown with the needle 226 positioned upright above the die 220. The needle 226 is positioned upright as a result of the steering actuator 236 causing the end of the needle to be vertically aligned with the tip of the needle 226 in an upright arrangement. In the first stage of FIG. 11, the needle 226 is shown parallel with a vertical (Z-axis) of the transfer apparatus 1000.

At the second stage of FIG. 11, the transfer apparatus 1000 is shown with the needle 226 oriented to direct a center-aligned axis of the needle in a direction other than vertical. In the transfer apparatus 1000, the needle 226 is tilted by causing the steering actuator 236 to move an end of the needle 226 along direction 238, thereby causing the needle 226 to pivot about the pivot 208. The steering actuator 236 may move the end of the needle 226 along an X-Y plane of the transfer apparatus, parallel with the plane of the substrate 210. The movement of the end of the needle 226 at a distance from the pivot 208 causes a predictable movement of the needle 226 and can be used to steer the needle 226 to direct towards a die and/or particular transfer location. In the second stage, the support 230 is shown tilting with the needle 226, as the support 230 may be coupled to a portion of the transfer mechanism, such as a sleeve that surrounds needle 226 at pivot 208. In an embodiment, the support 230 may not tilt with the needle, but may remain in the orientation shown with respect to the first stage. In an embodiment, the support 230 may be movable by one or more actuators along the X-Y plane to maintain alignment with the tip of the needle 226 as the needle is tilted.

Figure 12:
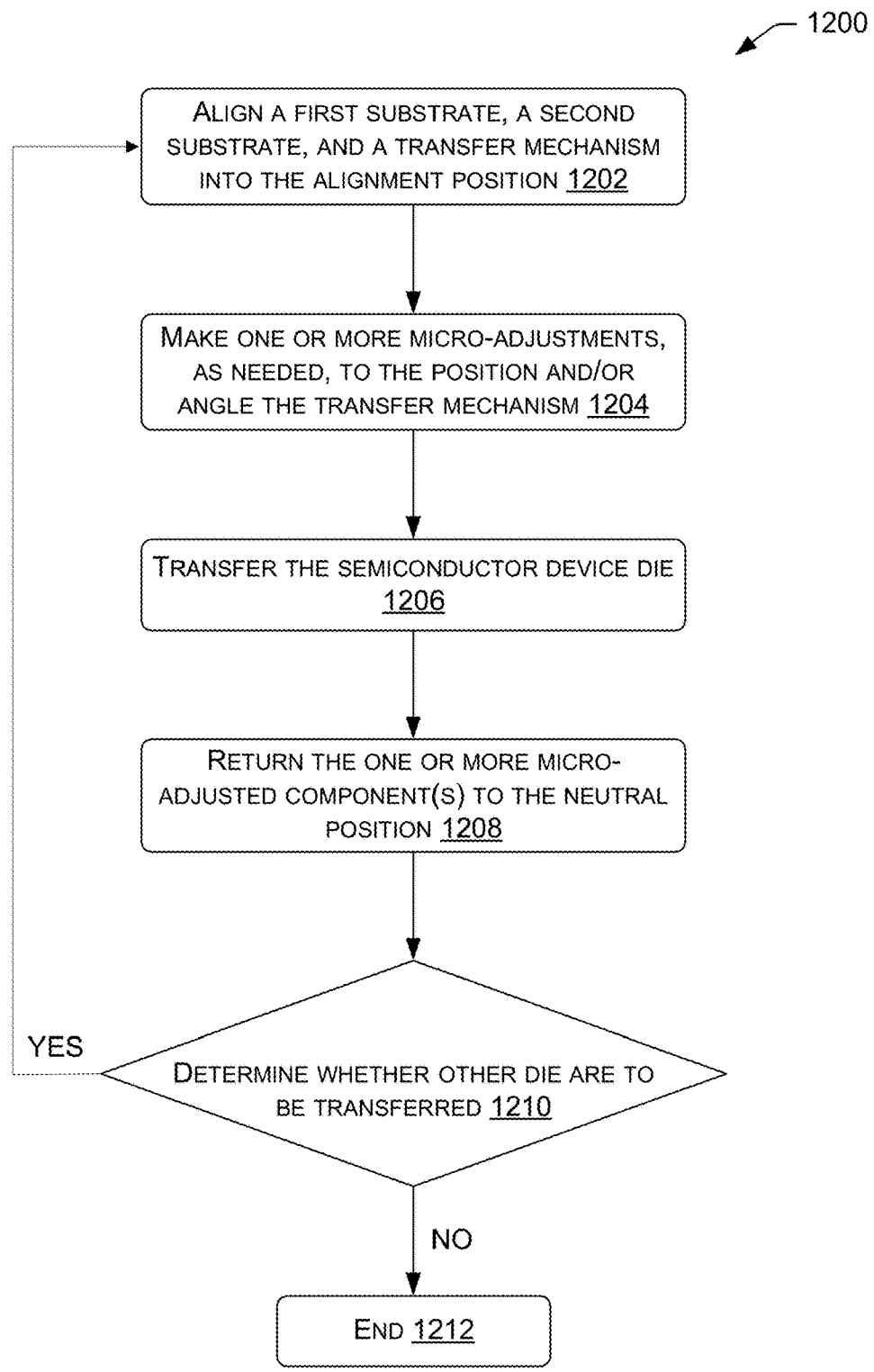
FIG. 12 illustrates a method for a die transfer process using a multi-axis die transfer apparatus according to this disclosure.

FIG. 12 depicts a method 1200 of a direct transfer operation of an embodiment of a direct transfer apparatus with a micro-adjustment mechanism, in which the conveyance mechanisms may either stop at each transfer alignment or may not stop completely at each transfer alignment, but rather may merely slow down.

The steps of the method 1200 described herein may not be in any particular order and, as such, may be executed in any satisfactory order to achieve a desired product state. For ease of explanation, the method 1200 is described as being performed at least in part by a direct transfer apparatus with a steerable needle as described herein.

The method 1200 of direct transfer operation (as well as each process described herein) is illustrated as a logical flow graph, where each respective operation may represent a sequence of operations that may be implemented by hardware, software, a combination thereof. In some situations, one or more of the operations may be implemented by one or more human users.

In the context of software, the operations may represent computer-executable instructions stored on one or more computer-readable media that, when executed by one or more processors, perform the recited operations. Generally, computer-executable instructions may include routines, programs, objects, components, data structures, and the like that perform particular functions or implement particular abstract data types.

The computer-readable media may include non-transitory computer readable storage media, which may include hard drives, floppy diskettes, optical disks, CD-ROMs, DVDs, read-only memories (ROMs), random access memories (RAMs), EPROMS, EEPROMS, flash memory, magnetic or optical cards, solid-state memory devices, or other types of storage media suitable for storing electronic instructions. In addition, in an embodiment, the computer-readable media may include a transitory computer-readable signal (in compressed or uncompressed form). Examples of computer-readable signals, whether modulated using a carrier or not, include, but are not limited to, signals that a computer system hosting or running a computer program may be configured to access, including signals downloaded through the Internet or other networks. Finally, unless otherwise noted, the order in which the operations are described is not intended to be construed as a limitation, and any number of the described operations may be combined in any order and/or in parallel to implement the process.

Now considering FIG. 12 in greater detail, at 1202, the PC (described herein above with respect to FIGS. 5-6) may instruct the system to align a first substrate (e.g., a die carrying substrate such as a wafer tape on which die are secured), a second substrate (a transfer substrate to which the die are to be transferred such as a circuit board or other die, etc.), and a transfer mechanism into the alignment position (discussed further herein). That is, in an embodiment, the PC may instruct any one or all of a first substrate conveyance mechanism, a second substrate conveyance mechanism, or the transfer mechanism to move into a transfer alignment position, in which a die is to be transferred from the first substrate to a transfer location on the second substrate. Note, it is contemplated that at least one of first substrate conveyance mechanism, the second substrate conveyance mechanism, and/or the transfer mechanism may be implemented therewith a micro-adjustment mechanism and the transfer mechanism includes a steerable needle such as described herein to minimize misalignment that may result from coarse movement and/or other factors in the transfer process.

As used herein, an alignment position may be a position within a range of alignment distances between the moving components. For example, an alignment position may occur when all three components (e.g., the transfer mechanism, the first substrate carrying the die to be transferred, and the second substrate having the target transfer location for the die) are aligned such that any variance in alignment (i.e., misalignment) between the three components ranges from 10 microns to 75 microns. In an embodiment, an alignment position may include a smaller range of allowable misalignment such as 10 microns to 20 microns. Other misalignment tolerance ranges are contemplated, and thus, are not limited to ranges discussed explicitly herein. An alignment position may also be described as a pre-transfer position, that is, a position where the three components are positioned such that a die to be transferred is within a threshold distance of the location it is to be placed by the needle.

In an embodiment, the alignment position may include a position where the transfer mechanism with the steerable needle may place multiple die onto the substrate. For example, by positioning between locations where two die are to be placed, the transfer mechanism may place each without requiring a coarse movement of the transfer mechanism due to the steerable needle.

With further respect to step 1202 above, in an embodiment, the system may align the substrates with the transfer mechanism to prepare for a die transfer using a full stop of the coarse movement(s) from the system component once the alignment position is attained. Upon stopping, a vibration of the structure may occur. For example, vibration may cause a shift in alignment as large as 30 microns to 50 microns as a result of the deceleration of moving masses.

In an embodiment, the alignment position may include a moving position. For example, as described herein, the steerable needle may be used to perform die transfer operations while the transfer mechanism and/or other components such as the wafer substrate and circuit trace are in motion relative to one another without stopping to settle.

Additionally, and/or alternatively, in an embodiment, the system may align the substrates with the transfer mechanism to prepare for a die transfer while one or more of the three components are in motion. For example, a conveyance mechanism conveying the first substrate may have instructions to maintain a deliberate, slow, continuous movement; or movement may be faster between coarse movements and then the system may reduce the velocity of the moving component as it approaches the desired transfer location. Thus, at a precise, determinable moment in time, the system may adjust steerable needle of the transfer mechanism such that the position of the die being transferred is motionless with respect to the target position and the transfer needle. That is, the relative velocity of the component being micro-adjusted becomes zero. In such embodiments, the steerable actuator may adjust the angle or tilt of the needle during an actuation of the needle. A possible advantage of the embodiment implementing continuous movement may include manufacturing efficiencies gained from time saved compared to waiting for system vibrations to settle at each transfer location.

In either embodiment, to determine the timing of the actuation and determine the control parameters at which the actuator is to be actuated, the cell manager (discussed with respect to FIG. 6) may determine real-time operational factors including velocity, acceleration, position, alignment between moving components, time, and other factors. Accordingly, prior to each actuation the sensor manager, motion manager, and die manager determine the timing and rate of actuation for operating the steering actuator.

At 1204, the transfer apparatus makes one or more micro-adjustments to the steering needle, to improve the alignment position and/or align the three components. The one or more micro-adjustments may be executed by displacing a component via actuation of at least one component of the steering actuator 236 of FIG. 2A.

At 1206, the apparatus transfers the semiconductor device die from the first substrate to the second substrate via actuation of the transfer mechanism (e.g., cycling a needle/pin/wire, pivoting collet, etc.).

At step 1208, the component(s) to which a micro-adjustment was made may be returned to the neutral position (at rest). For example, in an embodiment using spring members, the return force may occur automatically due to the nature of the spring members of a micro-adjustment mechanism; or in a different embodiment, the return force may be made by one or more of a second actuator, a third actuator, and/or a fourth actuator. The steering actuator may include such components to return the needle to a vertical position after transfer or, in an embodiment, may immediately adjust the needle to a position to prepare for a subsequent die transfer.

At 1210, the transfer apparatus determines whether another semiconductor device die are to be transferred. If no other die are to be transferred, the process ends at 1212. However, if it is determined that more die are to be transferred, the process may begin again at 1202. As part of the determination at 1210, the transfer apparatus may determine whether additional die may be transferred without requiring a coarse movement of the transfer mechanism, or other component. For example, the system may determine whether a subsequent die may be placed by adjusting the angle of the needle alone and/or in addition to micro-adjustment of the wafer substrate and circuit trace.

Although several embodiments have been described in language specific to structural features and/or methodological acts, it is to be understood that the claims are not necessarily limited to the specific features or acts described. Rather, the specific features and acts are disclosed as illustrative forms of implementing the claimed subject matter. Furthermore, the use of the term "may" herein is used to indicate the possibility of certain features being used in one or more various embodiments, but not necessarily in all embodiments.

What is claimed is:

1. An apparatus, comprising:
    a transfer mechanism configured to transfer an electrically-actuatable element directly from a wafer tape to a transfer location on a circuit trace, the transfer mechanism including:
        a needle pivotably coupled to a frame of the transfer mechanism at a pivot location;
        a first actuator configured to pivot the needle about the pivot location to align an axis of the needle with the transfer location;
        a second actuator configured to actuate the needle in a direction along the axis to press the electrically-actuatable element into contact with the circuit trace at the transfer location; and
        a controller configured to at least:
            determine an electrically actuatable element location on the wafer tape;
            determine an orientation for the needle based at least in part on the electrically-actuatable element location and the transfer location; and
            cause the first actuator to pivot the needle based on the orientation.

2. The apparatus according to claim 1, wherein the first actuator includes a first actuation mechanism and a second actuation mechanism, the first actuation mechanism arranged perpendicular to the second actuation mechanism.

3. The apparatus according to claim 2, wherein the first actuation mechanism includes a first electromechanical actuator and the second actuation mechanism includes a second electromechanical actuator.

4. The apparatus according to claim 2, wherein:
    the first actuation mechanism includes a first component positioned on a first side of the needle and a second component positioned on a second side of the needle opposite the first side; and
    the second actuation mechanism includes a third component positioned on a third side of the needle and a fourth component positioned on a fourth side of the needle opposite the third side.

5. The apparatus according to claim 1, further comprising a guide including a passage through which the needle passes, the guide coupled to the first actuator and configured to pivot the needle by changing a position of the guide.

6. The apparatus according to claim 1, wherein the apparatus is configured to accommodate the transfer of the electrically-actuatable element, which is a micro-sized unpackaged light-emitting diode ("LED"), a height of the micro-sized unpackaged LED ranging between 12.5 microns and 200 microns, or between 25 microns and 100 microns, or between 50 microns to 80 microns.

* * * * *